(12) United States Patent
Choi et al.

(10) Patent No.: US 11,711,943 B2
(45) Date of Patent: Jul. 25, 2023

(54) DISPLAY PANEL HAVING A VALLEY PORTION AND DISPLAY APPARATUS INCLUDING THE SAME

(71) Applicant: SAMSUNG DISPLAY CO., LTD., Yongin-si (KR)

(72) Inventors: Kyunghyun Choi, Yongin-si (KR); Seongjun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 95 days.

(21) Appl. No.: 17/345,743

(22) Filed: Jun. 11, 2021

(65) Prior Publication Data
US 2022/0052125 A1 Feb. 17, 2022

(30) Foreign Application Priority Data
Aug. 12, 2020 (KR) ........................ 10-2020-0101409

(51) Int. Cl.
*H01L 27/14* (2006.01)
*H01L 27/12* (2006.01)
(Continued)

(52) U.S. Cl.
CPC ......... *H10K 59/121* (2023.02); *H10K 50/844* (2023.02); *H10K 59/126* (2023.02); (Continued)

(58) Field of Classification Search
CPC ............... H01L 27/326; H01L 27/3218; H01L 27/3234; H01L 27/3276; H01L 27/3272; H01L 27/1218; H01L 27/1248; H01L 27/323; H01L 27/3211; H01L 27/14678; H01L 27/3246; H01L 27/3265; H01L 51/5253; H01L 51/5256; H01L 51/5246; H01L 51/0096; H01L 2251/301; G02F 1/133331; G02F 2001/133357; G06F 3/0412; G09F 9/301; G09F 9/33; G09G 2300/0408; G09G 2300/0804; H04M 1/0266; H04M 1/0264; H10K 59/121; H10K 59/126; H10K 59/353; H10K 59/65;
(Continued)

(56) References Cited

U.S. PATENT DOCUMENTS 10,396,311 B2 8/2019 Lee et al.
10,476,032 B2 11/2019 Park et al.
(Continued)

FOREIGN PATENT DOCUMENTS

CN 110890412 A 3/2020
CN 110910781 A 3/2020
(Continued)

*Primary Examiner* — Ida M Soward
(74) *Attorney, Agent, or Firm* — Lewis Roca Rothgerber Christie LLP

(57) ABSTRACT

Provided is a display panel including a main display area, a component area having a transmissive area, a peripheral area outside the main display area, a substrate, a bottom metal layer on the substrate, and defining an opening corresponding to the transmissive area, a valley portion adjacent to a boundary between the bottom metal layer and the transmissive area, and a thin-film encapsulation layer on the valley portion, and including an inorganic layer and an organic layer.

20 Claims, 20 Drawing Sheets

(51) Int. Cl.
| | |
|---|---|
| *H04M 1/04* | (2006.01) |
| *G09F 9/30* | (2006.01) |
| *G09F 9/33* | (2006.01) |
| *H10K 59/121* | (2023.01) |
| *H10K 50/844* | (2023.01) |
| *H10K 59/65* | (2023.01) |
| *H10K 59/126* | (2023.01) |
| *H10K 59/35* | (2023.01) |
| *H01L 27/146* | (2006.01) |
| *H10K 50/842* | (2023.01) |
| *H10K 59/122* | (2023.01) |
| *H10K 77/10* | (2023.01) |
| *H10K 102/00* | (2023.01) |

(52) U.S. Cl.
CPC ........... *H10K 59/353* (2023.02); *H10K 59/65* (2023.02); *G09G 2300/0408* (2013.01); *G09G 2300/0804* (2013.01); *H01L 27/14678* (2013.01); *H10K 50/8426* (2023.02); *H10K 59/122* (2023.02); *H10K 59/1216* (2023.02); *H10K 59/35* (2023.02); *H10K 77/10* (2023.02); *H10K 2102/00* (2023.02)

(58) Field of Classification Search
CPC .. H10K 59/1216; H10K 59/122; H10K 59/35; H10K 59/131; H10K 59/40; H10K 50/844; H10K 50/8426; H10K 50/8445; H10K 77/10; H10K 2102/00
See application file for complete search history.

(56) References Cited

U.S. PATENT DOCUMENTS

| | | | |
|---|---|---|---|
| 2009/0209068 A1* | 8/2009 | Chang | H01L 27/1248 |
| | | | 257/E21.414 |
| 2016/0233289 A1* | 8/2016 | Son | H01L 27/326 |
| 2017/0084635 A1* | 3/2017 | Jung | H01L 27/1285 |
| 2018/0301658 A1* | 10/2018 | Chung | H01L 27/326 |
| 2020/0235187 A1* | 7/2020 | Bae | H10K 59/00 |
| 2020/0273927 A1* | 8/2020 | Oh | H01L 27/326 |
| 2020/0365664 A1* | 11/2020 | Jeon | H01L 51/0027 |
| 2020/0365667 A1* | 11/2020 | Jo | H10K 71/00 |
| 2021/0091157 A1* | 3/2021 | Oh | H10K 59/121 |
| 2021/0126077 A1* | 4/2021 | Chae | H01L 27/3276 |
| 2021/0210723 A1* | 7/2021 | Han | H01L 51/5253 |

FOREIGN PATENT DOCUMENTS

| | | |
|---|---|---|
| KR | 10-2019-0027003 | 3/2019 |
| KR | 10-2019-0084194 | 7/2019 |

* cited by examiner

DISPLAY PANEL HAVING A VALLEY PORTION AND DISPLAY APPARATUS INCLUDING THE SAME

CROSS-REFERENCE TO RELATED APPLICATION

This application claims priority to, and the benefit of, Korean Patent Application No. 10-2020-0101409, filed on Aug. 12, 2020, in the Korean Intellectual Property Office, the disclosure of which is incorporated by reference herein in its entirety.

BACKGROUND

1. Field

One or more embodiments relate to a display panel and a display panel including an extended display area to display an image even in an area in which a component, such as an electronic element, is arranged, and to a display apparatus including the display panel.

2. Description of Related Art

Recently, the usage of display apparatuses has diversified. Also, display apparatuses have become thinner and more lightweight, and thus, the uses thereof have expanded.

As display apparatuses are used in various ways, there may be various methods for designing display apparatuses of various shapes, and the number of functions combined with or linked to display apparatuses has increased.

SUMMARY

One or more embodiments provide a display panel including a display area that is extended to display an image even in an area where a component, such as an electronic element, is arranged, and a display apparatus including the display panel. However, this is merely an example, and the disclosure is not limited thereto.

Additional aspects will be set forth in part in the description that follows and, in part, will be apparent from the description, or may be learned by practice of the presented embodiments of the disclosure.

According to some embodiments, a display panel includes a main display area, a component area having a transmissive area, a peripheral area outside the main display area, a substrate, a bottom metal layer on the substrate, and defining an opening corresponding to the transmissive area, a valley portion adjacent to a boundary between the bottom metal layer and the transmissive area, and a thin-film encapsulation layer on the valley portion, and including an inorganic layer and an organic layer.

The valley portion may be formed along an edge of the bottom metal layer, and may be arranged above the transmissive area.

The substrate may include a base layer, and a barrier layer above the base layer, wherein the valley portion is above the barrier layer.

A lower surface of the valley portion and an upper surface of the base layer may be apart by at least about 2,000 angstroms (Å).

The valley portion may have a height of about 5,000 angstroms (Å) or more and about 7,000 angstroms (Å) or less from the barrier layer.

The inorganic layer may be in the valley portion.

The valley portion may at least partially overlap the bottom metal layer.

A lower surface of the valley portion and an upper surface of the bottom metal layer may be apart by about 1,000 angstroms (Å) or more.

The display panel may further include a buffer layer above the substrate, wherein the valley portion has a height of about 5,000 angstroms (Å) to about 10,000 angstroms (Å) from the buffer layer.

The valley portion may include a first valley portion formed along an edge of the bottom metal layer and arranged above the transmissive area, and a second valley portion at least partially overlapping the bottom metal layer.

The inorganic layer may be in the first valley portion and in the second valley portion.

An edge of the bottom metal layer defining the opening may include first convex portions.

The valley portion may be formed along the edge of the bottom metal layer, and is arranged above the transmissive area.

The valley portion may include second convex portions corresponding to the first convex portions.

The valley portion may be above the transmissive area, and has an isolated shape.

According to some embodiments, a display apparatus includes a display panel including a main display area, a component area having a transmissive area, a peripheral area outside the main display area, a substrate, a bottom metal layer on the substrate, and defining an opening corresponding to the transmissive area, a valley portion adjacent to a boundary between the bottom metal layer and the transmissive area, and a thin-film encapsulation layer on the valley portion, and including an inorganic layer and an organic layer, the display apparatus also including a component arranged below the display panel to correspond to the component area.

The component may include an imaging device or a sensor.

The valley portion may be formed along an edge of the bottom metal layer and may be arranged above the transmissive area.

The valley portion may at least partially overlap the bottom metal layer.

The valley portion may include a first valley portion formed along an edge of the bottom metal layer and arranged above the transmissive area, and a second valley portion at least partially overlapping the bottom metal layer.

Aspects other than those described above will become apparent from the detailed content, claims, and drawings for carrying out the following embodiments.

BRIEF DESCRIPTION OF THE DRAWINGS

The above and other aspects of some embodiments of the disclosure will be more apparent from the following description taken in conjunction with the accompanying drawings, in which.

DETAILED DESCRIPTION

Figure 1:
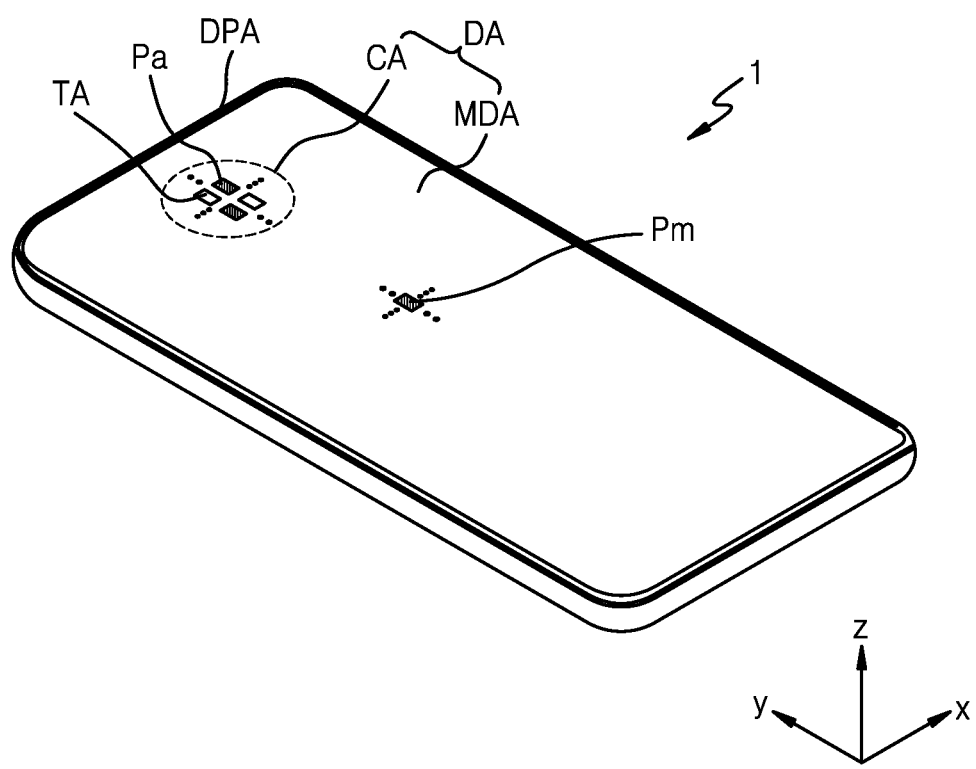
FIG. 1 is a perspective view schematically illustrating a display apparatus according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

In the following disclosure, it will be understood that when a line is referred to as "extending in a first direction or a second direction," it cannot only extend in a linear shape, but also can extend in the first direction or the second direction in a zigzag or curved line.

In the following disclosure, a "plan view" indicates that a portion of a target object is seen from above, and a "cross-sectional view" indicates that a portion of a target object is vertically cut and the cross-section is viewed from the side. In the following disclosure, a term "overlapping" includes overlapping in a plan view and a cross-sectional view.

The disclosure will now be described more fully with reference to the accompanying drawings, in which embodiments of the disclosure are shown.

FIG. 1 is a perspective view schematically illustrating a display apparatus 1 according to some embodiments.

Referring to FIG. 1, the display apparatus 1 may include a display area DA, and a peripheral area DPA outside the display area DA. The display area DA may include a component area CA, and a main display area MDA at least partially surrounding the component area CA. That is, each of the component area CA and the main display area MDA may display images individually, or the component area CA and the main display area MDA may display images together. The peripheral area DPA may be a kind of non-display area in which display elements are not arranged. The display area DA may be entirely surrounded by the peripheral area DPA.

In FIG. 1, one component area CA is in the main display area MDA. In other embodiments, the display apparatus 1 may include two or more component areas CA, and the shapes and sizes of the plurality of component areas CA may be different from each other. When viewed from a direction substantially perpendicular to an upper surface of the display apparatus 1 (e.g., in a plan view), the component area CA may have various shapes such as a circle, an ellipse, a polygon such as a square, a star shape, or a diamond shape. In FIG. 1, when viewed from a direction approximately perpendicular to the upper surface of display apparatus 1, the component area CA is in the upper center (+y direction) of the main display area MDA having a substantially rectangular shape, but the component area CA may be on one side, for example, on the upper right or upper left, of the rectangular main display area MDA.

The display apparatus 1 may provide an image by using a plurality of main subpixels Pm in the main display area MDA, and a plurality of auxiliary subpixels Pa in the component area CA.

In the component area CA, as will be described later below with reference to FIG. 2, a component 40, which is an electronic element, may be below the display panel to correspond to the component area CA. The component 40 may be a camera using infrared or visible light, and may be an imaging device. Alternatively, the component 40 may be a solar cell, a flash, an illuminance sensor, a proximity sensor, and an iris sensor. Alternatively, the component 40 may have a function of receiving sound. To reduce or minimize limitations on the functions of the component 40, the component area CA may include a transmissive area TA, through which light and/or sound, etc. that is output from the component 40 to the outside, or that travels from the outside toward the component 40, may pass. In a display panel according to some embodiments, and in a display apparatus including the display panel, when light is transmitted through the component area CA, light transmittance of the component area CA or the transmissive area TA may be about 10% or more, for example, about 40% or more, about 25% or more, about 50% or more, about 85% or more, or about 90% or more.

A plurality of auxiliary subpixels Pa may be in the component area CA. The plurality of auxiliary subpixels Pa may emit light to provide a certain image. An image displayed in the component area CA is an auxiliary image, which may have a lower resolution than an image displayed in the main display area MDA. That is, the component area CA includes the transmissive area TA through which light and sound may pass, and when a subpixel is not arranged on the transmissive area TA, the number of auxiliary subpixels Pa that may be arranged per unit area in the component area CA may be fewer than the number of main subpixels Pm arranged per unit area in the main display area MDA.

Alternatively, lines arranged per unit area in the component area CA may be less dense than lines arranged per unit area in the main display area MDA.

Figure 2:
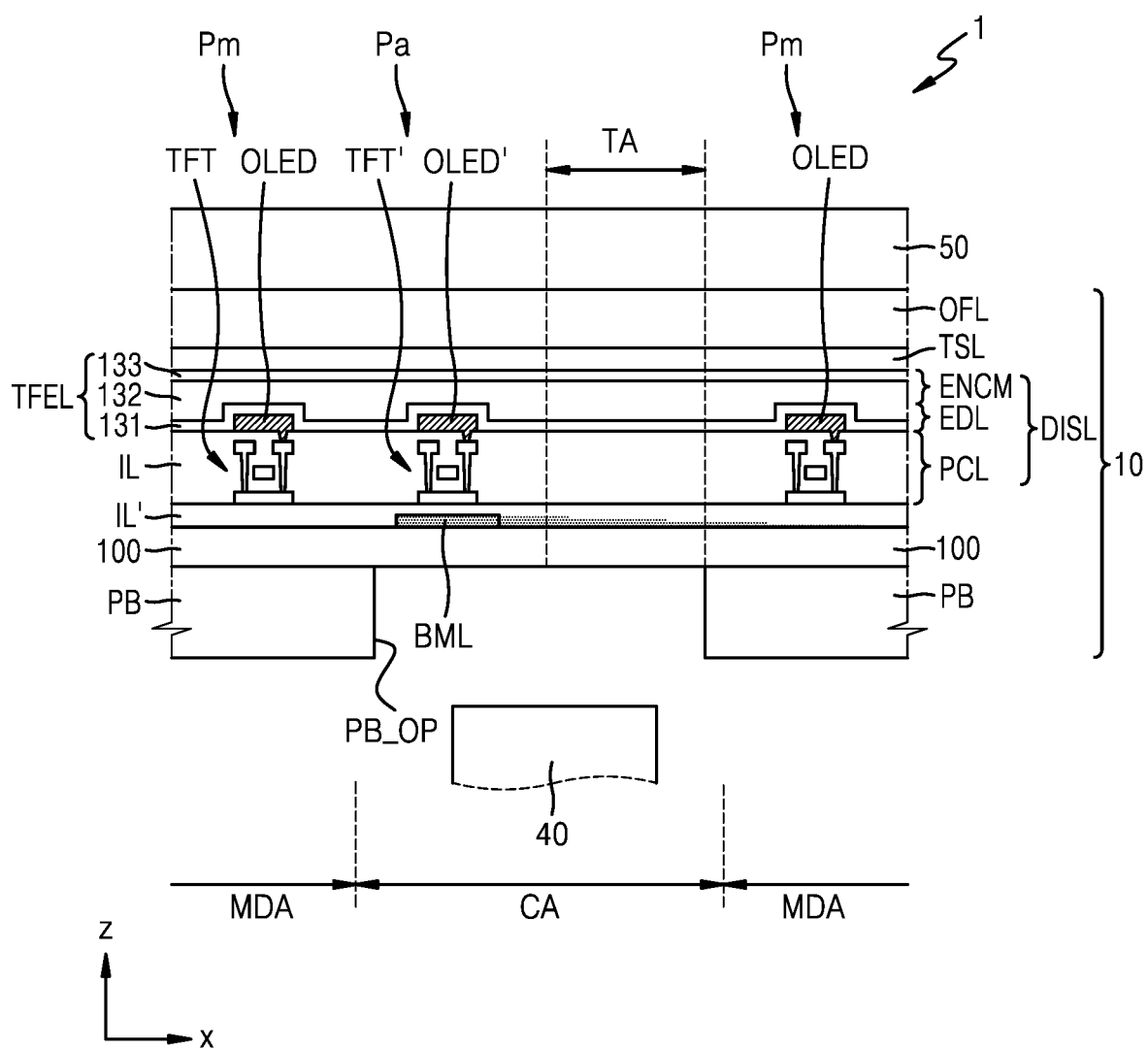
FIG. 2 is a cross-sectional view schematically illustrating a portion of a display apparatus according to some embodiments.

FIG. 2 is a cross-sectional view schematically illustrating a portion of the display apparatus 1 according to some embodiments.

Referring to FIG. 2, the display apparatus 1 may include a display panel 10, and the component 40 overlapping with the display panel 10. A cover window 50 for protecting the display panel 10 may be further arranged above the display panel 10.

The display panel 10 may include the component area CA overlapping with the component 40, and the main display area MDA in which a main image is displayed. The display panel 10 may include a substrate 100, a display layer DISL above the substrate 100, a touch screen layer TSL, an optical functional layer OFL, the cover window 50, and a panel protection member PB below the substrate 100.

The display layer DISL may include a circuit layer PCL including thin-film transistors TFT and TFT', a display element layer EDL including organic light-emitting diodes OLED and OLED' as display elements, and an encapsulation member ENCM such as a thin-film encapsulation layer TFEL or, in other embodiments, a sealing substrate. Insulating layers IL and IL' may be located between the substrate 100 and the display layer DISL and/or within the display layer DISL.

The substrate 100 includes an insulating material, such as a polymer resin, and may be a flexible substrate that is bendable, foldable, or rollable.

A main thin-film transistor TFT, and a main organic light-emitting diode OLED connected thereto, may be in the main display area MDA of the display panel 10 to implement a main subpixel Pm. An auxiliary thin-film transistor TFT', and an auxiliary organic light-emitting diode OLED' connected thereto, may be in the component area CA to implement an auxiliary subpixel Pa. An area in which the auxiliary subpixel Pa is arranged in the component area CA may be referred to as an auxiliary display area.

In the component area CA, a transmissive area TA, in which no display element is arranged, may be arranged. The transmissive area TA may be an area through which light/signal(s) emitted from the component 40 corresponding to the component area CA is transmitted, or an area through which light/signal(s) incident to the component 40 is transmitted. The auxiliary display area and the transmissive area TA may be alternately arranged in the component area CA.

A bottom metal layer BML may be in the component area CA. The bottom metal layer BML may be arranged to correspond to a lower portion of the auxiliary thin-film transistor TFT'. For example, the bottom metal layer BML may be between the auxiliary thin-film transistor TFT' and the substrate 100. The bottom metal layer BML may reduce or prevent external light reaching the auxiliary thin-film transistor TFT'. According to some embodiments, a static voltage or a signal is applied to the bottom metal layer BML, and thus, the bottom metal layer BML may reduce or prevent the likelihood of damage to a pixel circuit due to electrostatic discharge.

The display element layer EDL may be covered with the thin-film encapsulation layer TFEL or a sealing substrate. In some embodiments, the thin-film encapsulation layer TFEL may include at least one inorganic layer and at least one organic layer, as illustrated in FIG. 2. In some embodiments, the thin-film encapsulation layer TFEL may include a first inorganic film layer 131, a second inorganic film layer 133, and an organic film layer 132 therebetween.

The first inorganic film layer 131 and the second inorganic film layer 133 may include one or more inorganic insulating materials from among silicon oxide, silicon nitride, and silicon oxynitride. The organic film layer 132 may include a polymer-based material. The polymer-based material may include an acrylic resin, an epoxy resin, a polyimide, and a polyethylene.

In other embodiments, when the display element layer EDL is sealed with a sealing substrate, the sealing substrate may be arranged to face the substrate 100 with the display element layer EDL therebetween. There may be a gap between the sealing substrate and the display element layer EDL. The sealing substrate may include glass. A sealant made of a frit or the like may be between the substrate 100 and the sealing substrate, and the sealant may be in the peripheral area DPA described above. The sealant in the peripheral area DPA may surround the display area DA and reduce or prevent moisture otherwise penetrating through the side.

The touch screen layer TSL may obtain coordinate information according to an external input, for example, a touch event. The touch screen layer TSL may include a touch electrode, and touch lines connected to the touch electrode. The touch screen layer TSL may sense an external input according to a self capacitance method or a mutual capacitance method.

The touch screen layer TSL may be on the thin-film encapsulation layer TFEL. Alternatively, the touch screen layer TSL may be separately formed on the touch substrate, and may be then bonded onto the thin-film encapsulation layer TFEL through an adhesive layer, such as an optically clear adhesive (OCA). As some embodiments, the touch screen layer TSL may be formed directly above the thin-film encapsulation layer TFEL, and in this case, the adhesive layer might not be between the touch screen layer TSL and the thin-film encapsulation layer TFEL.

The optical functional layer OFL may be a layer provided to improve visibility. The optical functional layer OFL may include an anti-reflection layer. The anti-reflection layer may reduce the reflectivity of light (external light) incident from the outside toward the display apparatus 1.

In some embodiments, the anti-reflection layer may be provided as a polarizing film. The polarization film may include a linear planarization plate and a phase delay film, such as a quarter-wave ($\lambda/4$) plate. The phase delay film may be above the touch screen layer TSL, and the linear planarization plate may be above the phase delay film.

According to some embodiments, the anti-reflection layer may include a filter layer including a black matrix and color filters. The color filters may be arranged considering the colors of light beams respectively emitted by the pixels of the display apparatus 1. For example, the filter layer may include a color filter of a red, green, or blue color.

According to some embodiments, the anti-reflection layer may include a destructive interference structure. The destructive interference structure may include a first reflection layer and a second reflection layer that are arranged on different layers from each other. First reflected light and second reflected light reflected by the first reflective layer and the second reflective layer, respectively, may interfere with each other, and thus, the reflectance of external light may be reduced.

The cover window 50 may be above the display panel 10 to protect the display panel 10. The optical functional layer OFL may be attached to the cover window 50 with an optically clear adhesive, or may be attached to the touch screen layer TSL with an optically clear adhesive.

The panel protection member PB may be attached below the substrate 100 to support and protect the substrate 100. The panel protection member PB may include an opening PB_OP corresponding to the component area CA. The inclusion of the opening PB_OP in the panel protection member PB may improve the light transmittance of the component area CA. The panel protection member PB may include polyethylene terephthalate (PET) or polyimide (PI).

The component area CA may have an area that is greater than an area where the components 40 are arranged. Accordingly, an area of the opening PB_OP provided in the panel protection member PB may not match an area of the component area CA.

In addition, in some embodiments, a plurality of components 40 may be in the component area CA. The plurality of components 40 may have different functions from each other. For example, the plurality of components 40 may include at least two of a camera (imaging device), a solar cell, a flash, a proximity sensor, an illuminance sensor, and an iris sensor.

Figure 3:
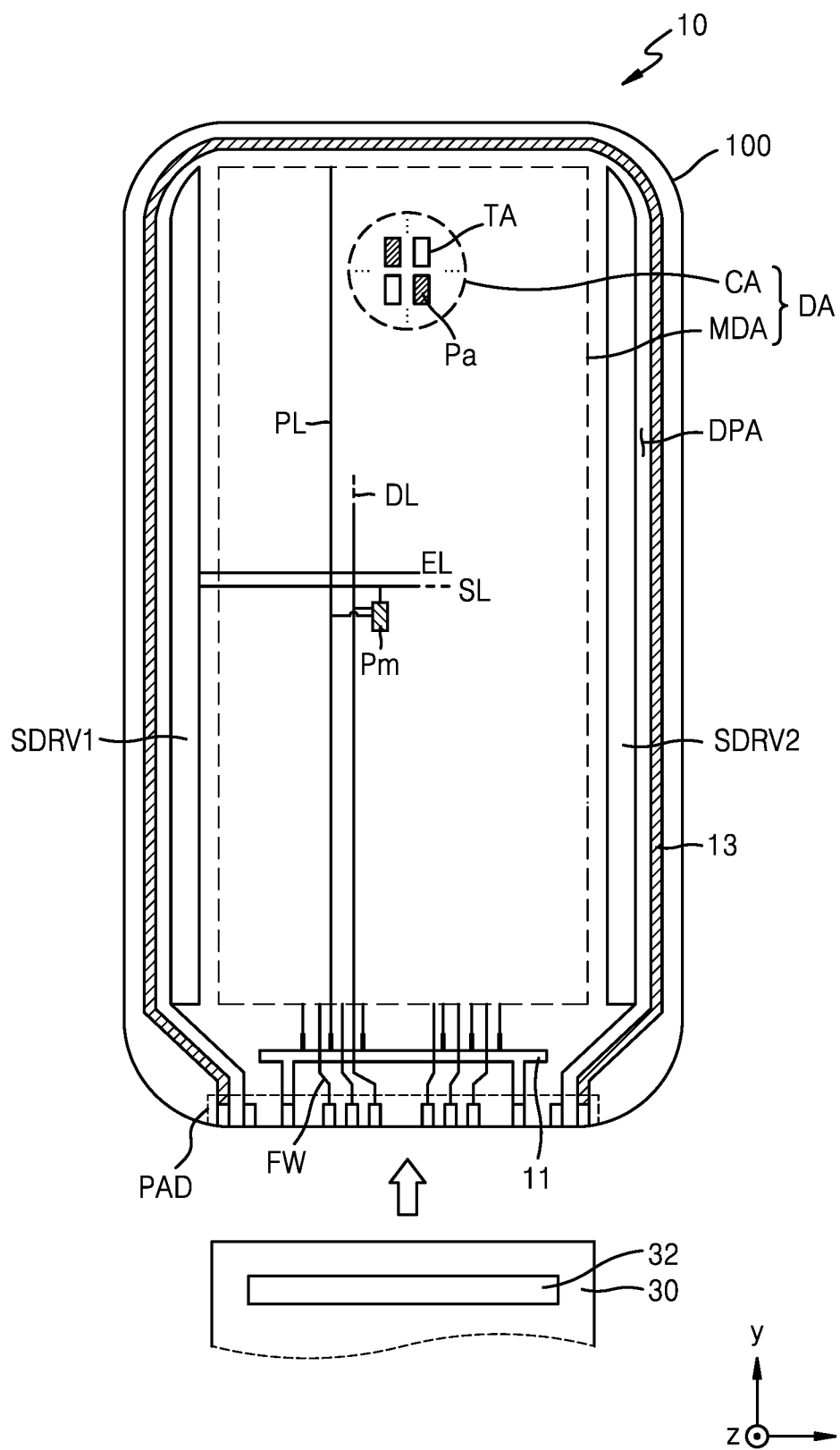
FIG. 3 is a plan view schematically illustrating a display panel that may be included in the display apparatus of FIG. 1, according to some embodiments.

FIG. 3 is a plan view schematically illustrating a display panel that may be included in the display apparatus of FIG. 1.

Referring to FIG. 3, various components included in the display panel 10 are above the substrate 100. The substrate 100 may include a display area DA, and a peripheral area DPA surrounding the display area DA. The display area DA may include a main display area MDA and a component area CA, wherein the main display area MDA displays a main image, and wherein the component area CA displays an auxiliary image and has a transmissive area TA. The auxiliary image may form one full image together with the main image, or may be an image that is independent of the main image.

A plurality of main subpixels Pm may be in the main display area MDA. Each of the plurality of main pixels Pm may be implemented as a display element, such as an organic light-emitting diode OLED. Each of the plurality of main subpixels Pm may emit, for example, red light, green light, blue light, or white light. The main display area MDA may be covered with an encapsulation member and protected from ambient air, moisture, or the like.

The component area CA may be on one side of the main display area MDA, as described above, or may be within the display area DA and surrounded by the main display area MDA. A plurality of auxiliary subpixels Pa may be in the component area CA. Each of the plurality of auxiliary subpixels Pa may be implemented as a display element, such as an auxiliary organic light-emitting diode OLED'. Each of the plurality of auxiliary subpixels Pa may emit, for example, red light, green light, blue light, or white light. The component CA may be covered with an encapsulation member and protected from ambient air, moisture, or the like.

Meanwhile, the component area CA may include a transmissive area TA. The transmissive area TA may be arranged to surround the plurality of auxiliary subpixels Pa. Alternatively, the transmissive areas TA may be arranged in a lattice configuration, together with the plurality of auxiliary subpixels Pa.

Because the component area CA has the transmissive area TA, the component area CA may have a lower resolution than the main display area MDA. For example, a resolution of the component area CA may be about ½, about ⅜, about ⅓, about ¼, about ⅖, about ⅛, about ⅑, or about 1/16 of a resolution of the main display area MDA. For example, the resolution of the main display area MDA may be about 400 ppi or greater, and the resolution of the component area CA may be about 200 ppi or about 100 ppi.

Alternatively, a resolution of the component area CA may be approximately equal to a resolution of the main display area MDA. In this case, the density of lines in the component area CA may be lowered to secure the light transmittance of the component area CA. That is, by making the density of lines arranged per unit area in the component area CA lower than the density of lines arranged per unit area in the main display area MDA, the light transmittance of the component area CA may be secured.

Each of pixel circuits driving the main and auxiliary subpixels Pm and Pa may be electrically connected to outer circuits in the peripheral area DPA. A first scan driving circuit SDRV1, a second scan driving circuit SDRV2, a terminal unit PAD, a driving voltage supply line 11, and a common voltage supply line 13 may be in the peripheral area DPA.

The first scan driving circuit SDRV1 may apply a scan signal, via a scan line SL, to each of the pixel circuits driving the main and auxiliary subpixels Pm and Pa. The first scan driving circuit SDRV1 may provide an emission control signal to each pixel circuit through an emission control line EL. The second scan driving circuit SDRV2 may be on the opposite side of the first scan driving circuit SDRV1 with respect to the main display area MDA, and may be approximately parallel to the first scan driving circuit SDRV1. Some pixel circuits of the main subpixels Pm of the main display area MDA may be electrically connected to the first scan driving circuit SDRV1, and the rest of the pixel circuits of the main subpixels Pm may be electrically connected to the second scan driving circuit SDRV2. Some pixel circuits of the auxiliary subpixels Pa of the component area MDA may be electrically connected to the first scan driving circuit SDRV1, and the rest of the pixel circuits of the auxiliary subpixels Pa may be electrically connected to the second scan driving circuit SDRV2. The second scan driving circuit SDRV2 may be omitted in other embodiments.

The terminal unit PAD may be on one side of the substrate 100. The terminal unit PAD is not covered by an insulating layer, and may be exposed to be connected to a display circuit board 30. A display driver 32 may be in the display circuit board 30.

The display driver 32 may generate control signals to be transmitted to the first scan driving circuit SDRV1 and to the second scan driving circuit SDRV2. The display driver 32 may generate a data signal, and the generated data signal may be transmitted to pixel circuits of the subpixels Pm and Pa through a respective fan-out wire FW and a respective data line DL connected to the fan-out wire FW.

The display driver 32 may apply a driving voltage ELVDD to the driving voltage supply line 11, and may apply a common voltage ELVSS to the common voltage supply line 13. The driving voltage ELVDD may be applied to a pixel circuit of the subpixels Pm and Pa through a driving voltage line PL connected to the driving voltage supply line 11, and the common voltage ELVSS may be connected to the common voltage supply line 13 and applied to an opposite electrode of a display element.

The driving voltage supply line 11 may be provided to extend in the x direction from below the main display area MDA. The common voltage supply line 13 may have a loop shape of which one side is open, and may surround a portion of the main display area MDA.

In FIG. 3, there is one component area CA. However, a plurality of component areas CA may be provided in other embodiments. In this case, the plurality of component areas CA may be apart from each other, a first camera may be arranged to correspond to one component area CA, and a second camera may be arranged to correspond to another component area CA. Alternatively, a camera may be arranged to correspond to one component area CA, and an infrared sensor may be arranged to correspond to another component area CA. The shapes and sizes of the plurality of component areas CA may be provided differently from each other.

Meanwhile, the component area CA may be provided in a polygonal shape. For example, the component area CA may be provided in an octagonal shape. The component area CA may be provided in a variety of polygons, such as a square or hexagon. The component area CA may be surrounded by the main display area MDA.

Figure 4:
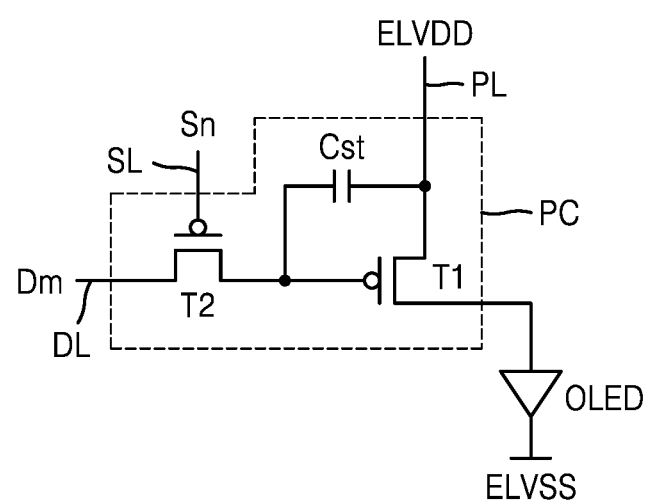
FIGS. 4 and 5 are equivalent circuit diagrams of a pixel circuit for driving subpixels, according to some embodiments.
Figure 5:
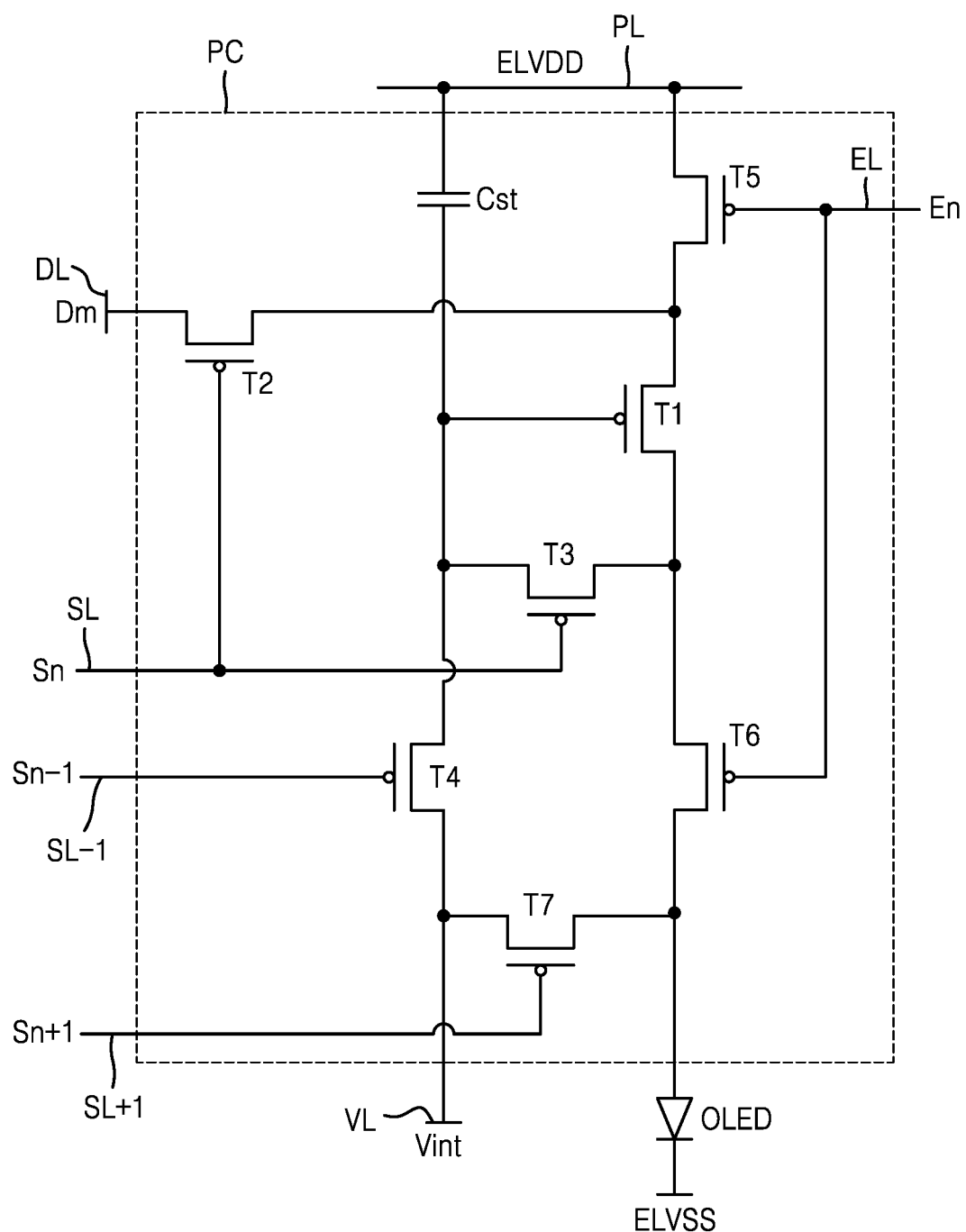

FIGS. 4 and 5 are equivalent circuit diagrams of a pixel circuit PC for driving subpixels, according to some embodiments.

Referring to FIG. 4, the pixel circuit PC may be connected to an organic light-emitting diode OLED, and may implement light emission of the subpixels. The pixel circuit PC may include a driving thin-film transistor T1, a switching thin-film transistor T2, and a storage capacitor Cst. The switching thin-film transistor T2 may be connected to a scan line SL and to a data line DL, and may transmit, to the driving thin-film transistor T1, a data signal Dm received via a data line DL according to a scan signal Sn received via the scan line SL.

The storage capacitor Cst may be connected to the switching thin-film transistor T2 and a driving voltage line PL, and may store a voltage corresponding to a difference between a voltage received from the switching thin-film transistor T2 and a voltage applied to the driving voltage line PL.

The driving thin-film transistor T1 is connected to the driving voltage line PL and the storage capacitor Cst, and may control driving current flowing from the driving voltage line PL to the organic light-emitting diode OLED, in accordance with a voltage value stored in the storage capacitor Cst. The organic light-emitting diode OLED may emit light having a certain luminance according to driving current.

Although FIG. 4 illustrates that the pixel circuit PC includes two thin-film transistors and one storage capacitor, the present disclosure is not limited thereto.

Referring to FIG. 5, the pixel circuit PC may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

Although FIG. 5 illustrates that each pixel circuit PC is provided with signal lines SL, SL−1, SL+1, EL, and DL, an initialization voltage line VL, and a driving voltage line PL, the present disclosure is not limited thereto. According to other embodiments, at least one of the signal lines SL, SL−1, SL+1, EL, and DL, and/or the initialization voltage line VL may be shared with neighboring pixel circuits.

A drain electrode of the driving thin-film transistor T1 may be electrically connected to an organic light-emitting diode OLED via the emission control thin-film transistor T6. The driving thin-film transistor T1 may supply driving current to the organic light-emitting diode OLED by receiving a data signal Dm according to a switching operation of the switching thin-film transistor T2.

A gate electrode of the switching thin-film transistor T2 may be connected to the scan line SL, and a source electrode of the switching thin-film transistor T2 may be connected to the data line DL. A drain electrode of the switching thin-film transistor T2 may be connected to a source electrode of the driving thin-film transistor T1 and connected to the driving voltage line PL via the operation control thin-film transistor T5.

The switching thin-film transistor T2 may be turned on according to a scan signal Sn received through the scan line SL, and may perform a switching operation for transmitting the data signal Dm transmitted to the data line DL to the source electrode of the driving thin-film transistor T1.

A gate electrode of the compensation thin-film transistor T3 may be connected to the scan line SL. A source electrode of the compensation thin-film transistor T3 may be connected to the drain electrode of the driving thin-film transistor T1 and connected to a pixel electrode of the organic light-emitting diode OLED via the emission control thin-film transistor T6. A drain electrode of the compensation thin-film transistor T3 may be connected to any one electrode of the storage capacitor Cst, a source electrode of the first initialization thin-film transistor T4, and the gate electrode of the driving thin-film transistor T1. The compensation thin-film transistor T3 is turned on according to the scan signal Sn received via the scan line SL, and may connect the gate electrode and the drain electrode of the driving thin-film transistor T1 to each other, thus achieving diode-connection of the driving thin-film transistor T1.

A gate electrode of the first initialization thin-film transistor T4 may be connected to a previous scan line SL−1. A drain electrode of the first initialization thin-film transistor T4 may be connected to the initialization voltage line VL. The source electrode of the first initialization thin-film transistor T4 may be connected to any one electrode of the storage capacitor Cst, the drain electrode of the compensation thin-film transistor T3, and the gate electrode of the driving thin-film transistor T1. The first initialization thin-film transistor T4 may be turned on according to a previous scan signal Sn−1 received through the previous scan line SL−1, and may be configured to deliver an initialization voltage Vint to the gate electrode of the driving thin-film transistor T1 to perform an initialization operation of initializing a voltage of the gate electrode of the driving thin-film transistor T1.

A gate electrode of the operation control thin-film transistor T5 may be connected to an emission control line EL. A source electrode of the operation control thin-film transistor T5 may be connected to the driving voltage line PL. A drain electrode of the operation control thin-film transistor T5 may be connected to the source electrode of the driving thin-film transistor T1 and to the drain electrode of the switching thin-film transistor T2.

A gate electrode of emission control thin-film transistor T6 may be connected to the emission control line EL. A source electrode of the emission control thin-film transistor T6 may be connected to the drain electrode of the driving thin-film transistor T1 and to the source electrode of the compensation thin-film transistor T3. A drain electrode of the emission control thin-film transistor T6 may be electrically connected to the pixel electrode of the organic light-emitting diode OLED. The operation control thin-film transistor T5 and the emission control thin-film transistor T6 may be concurrently or substantially simultaneously turned on according to an emission control signal En received through the emission control line EL, and a driving voltage ELVDD may be transmitted to the organic light-emitting diode OLED to allow driving current to flow through the organic light-emitting diode OLED.

A gate electrode of the second initialization thin-film transistor T7 may be connected to a following, or subsequent, scan line SL+1. A source electrode of the second initialization thin-film transistor T7 may be connected to the pixel electrode of the organic light-emitting diode OLED. A drain electrode of the second initialization thin-film transistor T7 may be connected to the initialization voltage line VL. The second initialization thin-film transistor T7 may be turned on according to a following, or subsequent, scan signal Sn+1 received through the following scan line SL+1, and may initialize the pixel electrode of the organic light-emitting diode OLED.

Although FIG. 5 illustrates that the first initialization thin-film transistor T4 and the second initialization thin-film transistor T7 are connected to the previous scan line SL−1 and the following scan line SL+1, respectively, the present disclosure is not limited thereto. In other embodiments, the first initialization thin-film transistor T4 and the second initialization thin-film transistor T7 may be both connected to the previous scan line SL−1 and driven according to the previous scan signal Sn−1.

Any one electrode of the storage capacitor Cst may be connected to the gate electrode of the driving thin-film transistor T1, the drain electrode of the compensation thin-film transistor T3, and the source electrode of the first initialization thin-film transistor T4. The other electrode of the storage capacitor Cst may be connected to the driving voltage line PL.

An opposite electrode (for example, the cathode electrode) of the organic light-emitting diode OLED receives a common voltage ELVSS. The organic light-emitting diode OLED receives a driving current from the driving thin-film transistor T1 to emit light.

The pixel circuit PC is not limited to the number and circuit design of the thin-film transistors and the storage capacitor described with reference to FIGS. 4 and 5, and the number and the circuit design thereof may be variously changed.

The pixel circuits PC driving the main subpixel Pm and the auxiliary subpixel Pa may be provided identically, or may be provided differently. For example, the pixel circuits PC driving the main subpixel Pm and the auxiliary subpixel Pa may be provided as the pixel circuit PC shown in FIG. 5. According to other embodiments, the pixel circuit PC of FIG. 5 may be used as a pixel circuit PC driving a main subpixel Pm, and the pixel circuit PC of FIG. 4 may be used as a pixel circuit PC driving an auxiliary subpixel Pa.

Figure 6:
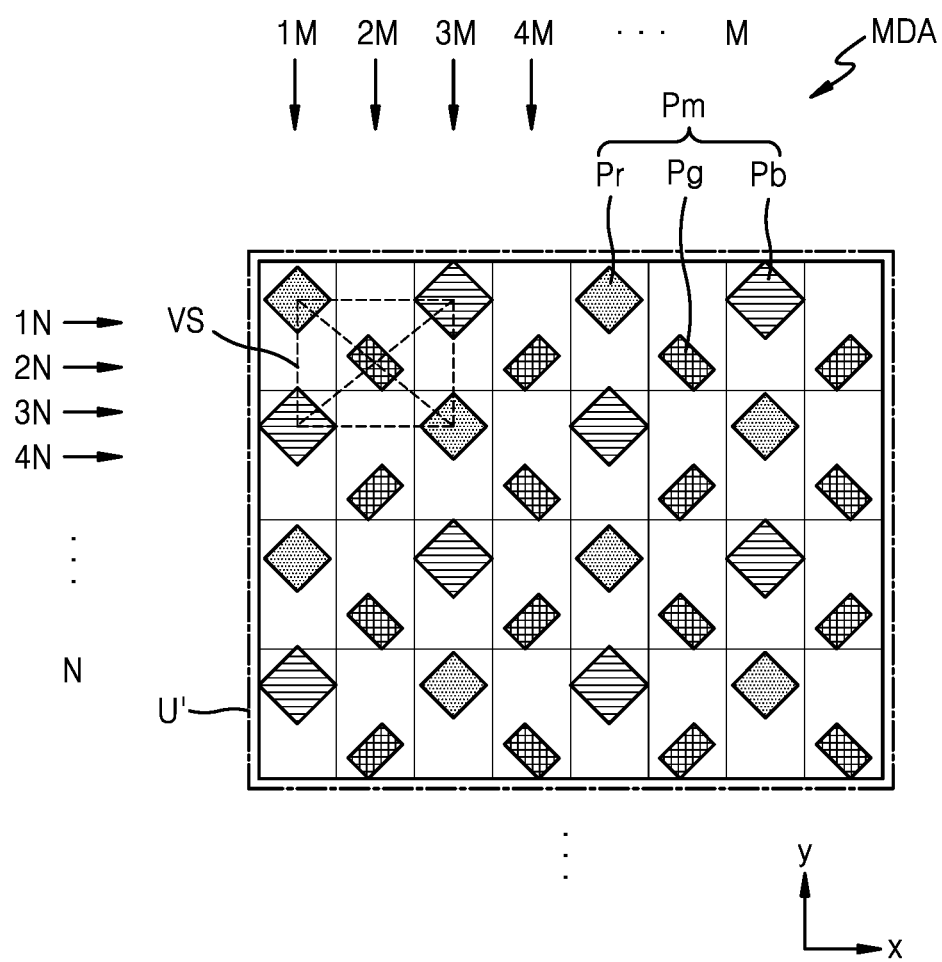
FIG. 6 is a layout view schematically illustrating a pixel arrangement structure in a main display area according to some embodiments.

FIG. 6 is a layout view schematically illustrating a pixel arrangement structure in a main display area, according to some embodiments.

A plurality of main subpixels Pm may be in the main display area MDA. In this specification, a subpixel is a minimum unit for implementing an image, and refers to a light-emission area. When an organic light-emitting diode is used as a display element, the light-emission area may be defined by an opening in a pixel-defining layer. This will be described later below.

As shown in FIG. 6, the main subpixels Pm in the main display area MDA may be arranged in a PENTILE® arrangement structure (PENTILE® is a registered trademark of Samsung Display Co., Ltd., Republic of Korea). This pixel arrangement structure may be referred to as an RGBG matrix structure (e.g., a PENTILE® matrix structure or an RGBG structure (e.g., a PENTILE® structure)). The main subpixel Pm may include a first subpixel Pr, a second subpixel Pg, and a third subpixel Pb, and the first subpixel Pr, the second subpixel Pg, and the third subpixel Pb may implement red, green, and blue, respectively.

A plurality of first subpixels Pr and a plurality of third subpixels Pb are alternately arranged in a first row 1N, a plurality of second subpixels Pg are arranged at preset intervals in a second row 2N adjacent to the first row 1N, a plurality of third subpixels Pb and a plurality of first subpixels Pr are alternately arranged in a third row 3N adjacent to the second row 2N, and a plurality of second subpixels Pg are arranged at preset intervals in a fourth row 4N adjacent to the third row 3N. This pixel arrangement is repeated until an N-th row. In this case, each of the first subpixel Pr and the third subpixel Pb may be provided to be larger than the second subpixel Pg.

The plurality of first subpixels Pr and the plurality of third subpixels Pb arranged in the first row 1N and the plurality of second subpixels Pg arranged in the second row 2N are arranged in a staggered manner. Thus, a plurality of first subpixels Pr and a plurality of third subpixels Pb are alternately arranged in a first column 1M, a plurality of second subpixels Pg are arranged at preset intervals in a second column 2M adjacent to the first column 1M, a plurality of third subpixels Pb and a plurality of first subpixels Pr are alternately arranged in a third column 3M adjacent to the second column 2M, and a plurality of second subpixels Pg are arranged at preset intervals in a fourth column 4M adjacent to the third column 3M. This pixel arrangement is repeated until an M-th column.

When the pixel arrangement structure is expressed differently, from among vertices of a virtual quadrilateral VS having the central point thereof at the central point of a second subpixel Pg, first subpixels Pr are respectively arranged at first and third vertices facing each other, and third subpixels Pb are respectively at second and fourth vertices. The virtual quadrilateral VS may be a rectangle, a rhombus, a square, or the like.

This pixel arrangement structure is referred to as a PENTILE® matrix structure, or a PENTILE® structure (PENTILE® is a registered trademark of Samsung Display Co., Ltd., Republic of Korea). By applying rendering, in which a color of a pixel is represented by sharing the colors of its adjacent pixels, a high resolution may be obtained via a small number of pixels.

In FIG. 6, a plurality of main subpixels Pm are arranged in a PENTILE® matrix structure (PENTILE® is a registered trademark of Samsung Display Co., Ltd., Republic of Korea), but the present disclosure is not limited thereto. For example, the plurality of main subpixels Pm may be arranged in various configurations, such as a stripe structure, a mosaic arrangement structure, and a delta arrangement structure.

Figure 7:
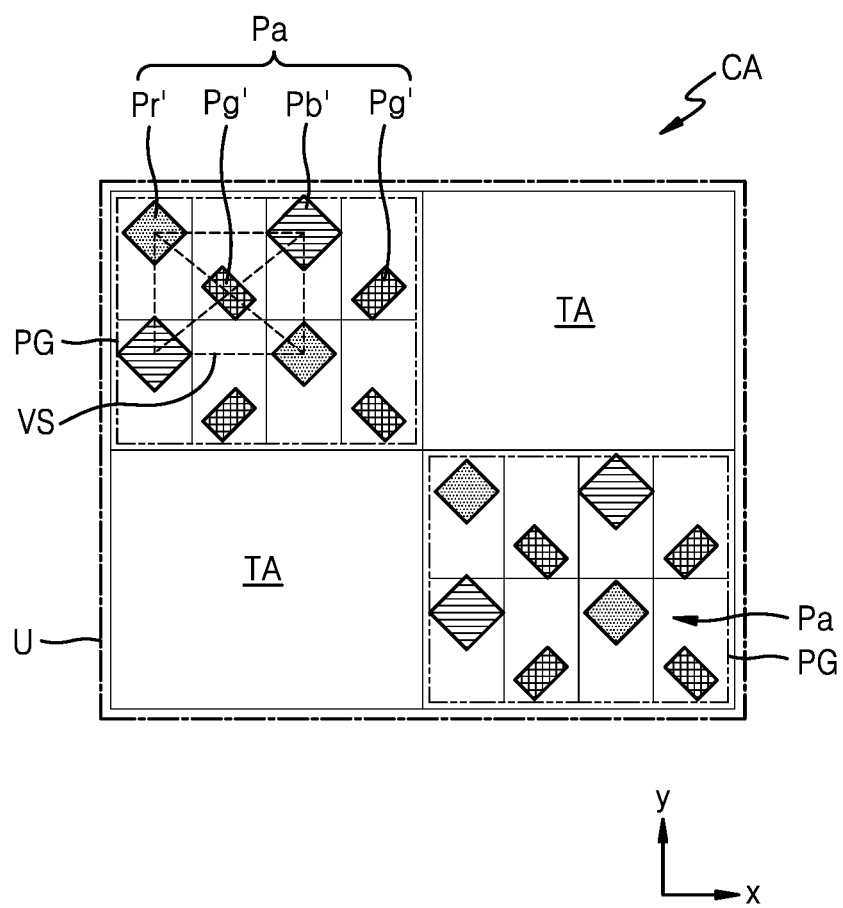
FIGS. 7 and 8 are layout views each schematically illustrating a pixel arrangement structure in a component area according to embodiments.
Figure 8:
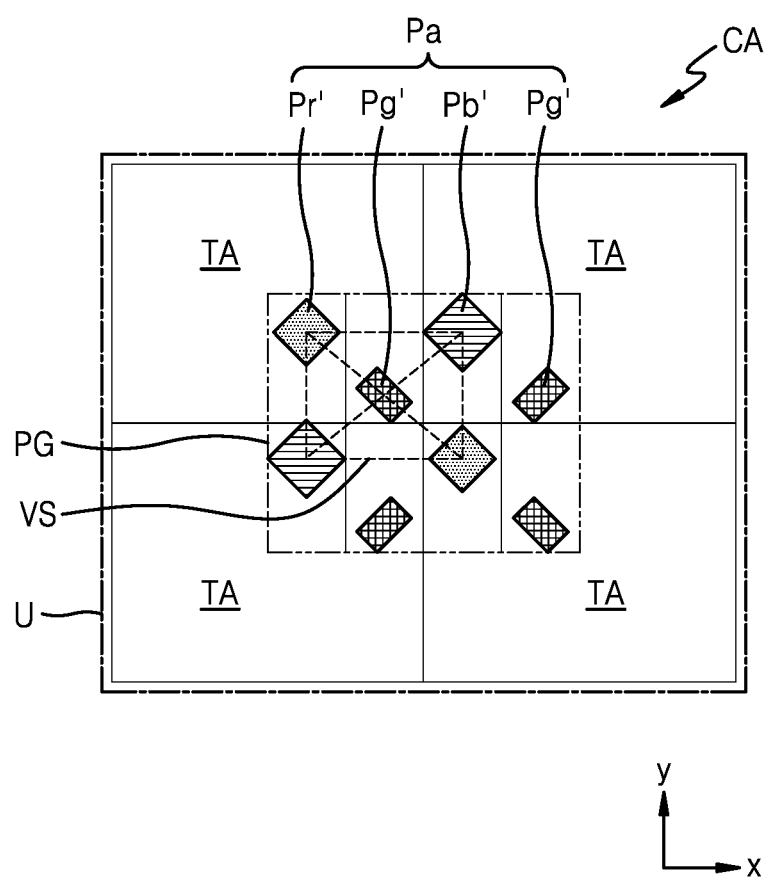

FIGS. 7 and 8 are layout views each schematically illustrating a pixel arrangement structure in a component area CA, according to embodiments.

Referring to FIG. 7, a plurality of auxiliary subpixels Pa may be in the component area CA. Each of the auxiliary sub-pixels Pa may emit light of any one of red, green, blue, and white.

The component area CA may include a pixel group PG and a transmissive area TA, the pixel group PG including at least one auxiliary subpixel Pa. The pixel group PG and the transmissive area TA are alternately arranged in the x and y directions, and may be arranged in a lattice shape, for example. In this case, the component area CA may include a plurality of pixel groups PG and a plurality of transmissive areas TA.

The pixel group PG may be defined as a subpixel aggregate in which a plurality of auxiliary subpixels Pa are grouped into a preset unit. For example, as shown in FIG. 7, one pixel group PG may include eight auxiliary subpixels Pa arranged in a PENTILE® structure (PENTILE® is a registered trademark of Samsung Display Co., Ltd., Republic of Korea). That is, one pixel group PG may include two first subpixels Pr', four second subpixels Pg', and two third subpixels Pb'.

In the component area CA, a basic unit U, in which a suitable or preset number of pixel groups PG and a suitable or preset number of transmissive areas TA are grouped together, may be repeatedly arranged in the x and y directions. In FIG. 7, the basic unit U may have a shape in which two pixel groups PG and two transmissive areas TA arranged therearound are grouped in a quadrilateral shape. The basic unit U is a division of a repetitive shape, and does not mean a break in the composition.

A corresponding unit U' provided in the main display area MDA with an area equal to an area of the basic unit U may be set or selected. In this case, the number of main subpixels Pm included in the corresponding unit U' may be greater than the number of auxiliary subpixels Pa included in the basic unit U. That is, the number of auxiliary subpixels Pa included in the basic unit U may be about 16 while the number of main subpixel Pm included in the corresponding unit U' may be about 32, and the number of auxiliary subpixels Pa and the number of main subpixels Pm arranged per same area may be provided in a ratio of about 1:2.

As shown in FIG. 7, the pixel arrangement structure of the component area CA, in which the arrangement structure of the auxiliary subpixels Pa is a PENTILE® structure (PEN- TILE® is a registered trademark of Samsung Display Co., Ltd., Republic of Korea), and a resolution of which is about ½ of that of the main display area MDA, is referred to as a ½ PENTILE® structure (PENTILE® is a registered trademark of Samsung Display Co., Ltd., Republic of Korea). The number or arrangement of auxiliary subpixels Pa included in the pixel group PG may be modified and designed according to a resolution of the component area CA.

Referring to FIG. 8, the pixel arrangement structure of the component area CA may be provided in a ¼ PENTILE® structure (PENTILE® is a registered trademark of Samsung Display Co., Ltd., Republic of Korea). In some embodiments, a pixel group PG includes eight auxiliary subpixels Pa arranged in a PENTILE® structure (PENTILE® is a registered trademark of Samsung Display Co., Ltd., Republic of Korea), but the basic unit U may include only one pixel group PG. The other areas of the basic unit U may be provided as a transmissive area TA. Accordingly, the number of auxiliary subpixels Pa and the number of main subpixels Pm arranged per same area may be provided in a ratio of about 1:4. In this case, one pixel group PG may be surrounded by the transmissive area TA.

In FIGS. 7 and 8, a plurality of auxiliary subpixels Pa are arranged in a PENTILE® matrix structure (PENTILE® is a registered trademark of Samsung Display Co., Ltd., Republic of Korea), but the present disclosure is not limited thereto. For example, the plurality of auxiliary subpixels Pa may be arranged in various configurations, such as a stripe structure, a mosaic arrangement structure, and a delta arrangement structure.

In addition, the shape of the auxiliary subpixel Pa in FIGS. 7 and 8 may be identical to that of the main subpixel Pm in FIG. 6, but the present disclosure is not limited thereto. The auxiliary subpixel Pa may be arranged in a different shape from the main subpixel Pm.

In FIGS. 7 and 8, the auxiliary subpixel Pa is equal in size to the main subpixel Pm in FIG. 6, but the present disclosure is not limited thereto. The size of the auxiliary subpixel Pa may be greater than the size of the main subpixel Pm emitting light of the same color. For example, the size of the third subpixel Pb of the auxiliary subpixel Pa may be greater than the size of the third subpixel Pb' of the main subpixel Pm. The difference in size may be designed considering a difference in brightness and/or resolution between the component area CA and the main display area MDA.

Figure 9:
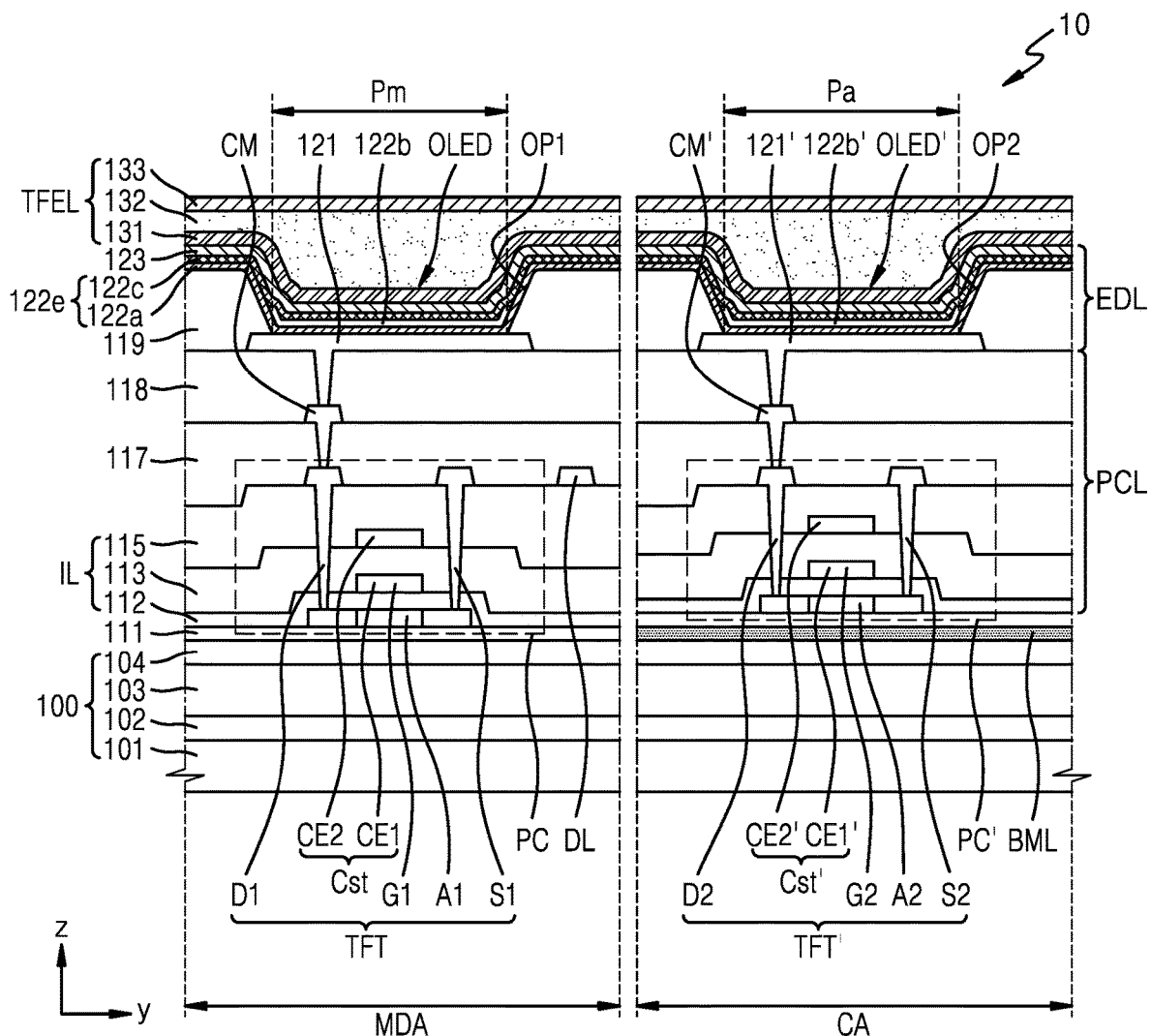
FIG. 9 is a cross-sectional view illustrating a portion of a display panel including a main display area and a component area according to some embodiments.

FIG. 9 is a cross-sectional view illustrating a portion of a display panel according to some embodiments, and schematically illustrates a main display area and a component area.

Referring to FIG. 9, the display panel 10 includes a main display area MDA and a component area CA. A main subpixel Pm may be in the main display area MDA, and an auxiliary subpixel Pa may be in the component area CA. The main display area MDA may include a main pixel circuit PC and a main organic light-emitting diode OLED, the main pixel circuit PC including a main thin-film transistor TFT and a main storage capacitor Cst, and the main organic light-emitting diode OLED being a display element connected to the main pixel circuit PC. The component area CA may include an auxiliary pixel circuit PC' and an auxiliary organic light-emitting diode OLED', the auxiliary pixel circuit PC' including an auxiliary thin-film transistor TFT' and an auxiliary storage capacitor Cst', and the auxiliary organic light-emitting diode OLED' being a display element connected to the auxiliary pixel circuit PC'.

According to some embodiments, an organic light-emitting diode is used as a display element. However, according to other embodiments, an inorganic light-emitting device or a quantum dot light-emitting device may be used as a display element.

A structure in which components included in the display panel 10 are stacked will now be described below. The display panel 10 may be a stack of a substrate 100, a buffer layer 111, a circuit layer PCL, a display element layer EDL, and a thin-film encapsulation layer TFEL as a sealing member.

The substrate 100 may include an insulative material, such as polymer resin. The substrate 100 may be a flexible substrate that is bendable, foldable, or rollable.

In some embodiments, the substrate 100 may include a first base layer 101, a first barrier layer 102, a second base layer 103, and a second barrier layer 104 that are sequentially stacked.

The first base layer 101 and the second base layer 103 may each include a polymer resin having high thermal resistance. For example, the first base layer 101 and the second base layer 103 may include at least one selected from the group consisting of polyethersulfone, polyacrylate, polyether imide, polyethylene naphthalate, polyethylene terephthalate, polyphenylene sulfide, polyarylate, polyimide, polycarbonate, cellulose triacetate, cellulose acetate propionate, and polyarylene ethersulfone. For example, the first base layer 101 and the second base layer 103 may be provided with polyimide. The first barrier layer 102 and the second barrier layer 104 may each include one of silicon nitride ($SiN_x$), silicon oxide ($SiO_x$), aluminum oxide ($Al_2O_3$), and zirconium oxide ($Zr_2O_3$). The first barrier layer 102 and the second barrier layer 104 may block the penetration of ambient air.

The buffer layer 111 may be arranged above the substrate 100, may reduce or prevent infiltration of a foreign material, moisture, or ambient air into a lower portion of the substrate 100, and may provide a flat surface on the substrate 100. The buffer layer 111 may include an inorganic material such as an oxide or nitride, an organic material, or an organic-inorganic composite material, and may have a single layer structure or multilayer structure of an inorganic material or an organic material. In some embodiments, the buffer layer 111 may include silicon oxide ($SiO_x$) or silicon nitride ($SiN_x$). In some embodiments, the buffer layer 111 may be provided by stacking silicon oxide ($SiO_x$) and silicon nitride ($SiN_x$).

In component area CA, a bottom metal layer BML may be between the substrate 100 and the buffer layer 111. The bottom metal layer BML is arranged below the auxiliary pixel circuit PC', and may reduce or prevent degradation of characteristics of the auxiliary thin-film transistor TFT' due to light emitted from, for example, a component. The bottom metal layer BML may reduce or prevent light that is emitted from the component or the like, or that heads toward the component, from being diffracted through a narrow gap between lines connected to the auxiliary pixel circuit PC'.

A bias voltage may be applied to the bottom metal layer BML. Due to the bottom metal layer BML receiving a bias voltage, the probability that electrostatic discharge occurs may be significantly reduced. The bottom metal layer BML may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The bottom metal layer BML may be a single layer or multilayer including one or more of the aforementioned materials.

The circuit layer PCL is above the buffer layer 111, and may include the pixel circuits PC and PC', a first insulating layer 112, a second insulating layer 113, a third insulating layer 115, and a first planarization layer 117. The main pixel circuit PC may include the main thin-film transistor TFT and the main storage capacitor Cst, and the auxiliary pixel circuit PC' may include the auxiliary thin-film transistor TFT' and the auxiliary storage capacitor Cst'.

The main thin-film transistor TFT and the auxiliary thin-film transistor TFT' may be above the buffer layer 111. The main thin-film transistor TFT may include a first semiconductor layer A1, a first gate electrode G1, a first source electrode S1, and a first drain electrode D1, and the auxiliary thin-film transistor TFT' may include a second semiconductor layer A2, a second gate electrode G2, a second source electrode S2, and a second drain electrode D2. The main thin-film transistor TFT may be connected to the main organic light-emitting diode OLED to drive the main organic light-emitting diode OLED. The auxiliary thin-film transistor TFT' may be connected to an auxiliary organic light-emitting diode OLED' to drive the auxiliary organic light-emitting diode OLED'.

The first semiconductor layer A1 and the second semiconductor layer A2 are above the buffer layer 111 and may include polysilicon. In other embodiments, the first semiconductor layer A1 and the second semiconductor layer A2 may include amorphous silicon. In other embodiments, the first semiconductor layer A1 and the second semiconductor layer A2 may each include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The first semiconductor layer A1 and the second semiconductor layer A2 may each include a channel area, and source and drain areas that are doped with impurities.

The second semiconductor layer A2 may overlap the bottom metal layer BML with the buffer layer 111 therebetween. In some embodiments, a width of the second semiconductor layer A2 may be formed to be less than a width of the bottom metal layer BML, and thus, when projection is performed in a direction perpendicular to the substrate 100, the second semiconductor layer A2 may entirely overlap the bottom metal layer BML.

The first insulating layer 112 may be provided to cover the first semiconductor layer A1 and the second semiconductor layer A2. The first insulating layer 112 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The first insulating layer 112 may include a single layer or a multilayer, each including the above-stated inorganic insulating materials.

The first gate electrode G1 and the second gate electrode G2 may be above the first insulating layer 112 so as to overlap the first semiconductor layer A1 and the second semiconductor layer A2, respectively. Each of the first gate electrode G1 and the second gate electrode G2 may include molybdenum (Mo), aluminum (Al), copper (Cu), or titanium (Ti) and may be formed as a single layer or multiple layers. For example, each of the first gate electrode G1 and the second gate electrode G2 may be provided in a single Mo layer.

The second insulating layer 113 may be provided to cover the first gate electrode G1 and the second gate electrode G2. The second insulating layer 113 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The second insulating layer 113 may include a single layer or a multilayer, each including one or more of the above-stated inorganic insulating materials.

A first upper electrode CE2 of the main storage capacitor Cst and a second upper electrode CE2' of the auxiliary storage capacitor Cst' may be above the second insulating layer 113.

In the main display area MDA, the first upper electrode CE2 may overlap the first gate electrode G1 therebelow. The first gate electrode G1 and the first upper electrode CE2, which overlap each other with the second insulating layer 113 therebetween, may form the main storage capacitor Cst. According to some embodiments, the first gate electrode G1 may be a first lower electrode CE1 of the main storage capacitor Cst. In other embodiments, the first lower electrode CE1 of the main storage capacitor Cst may be an independent component that is separate from the first gate electrode G1 of the main thin-film transistor TFT.

In the component area CA, the second upper electrode CE2' may overlap the second gate electrode G2 therebelow. The second gate electrode G2 and the second upper electrode CE2', which overlap each other with the second insulating layer 113 therebetween, may form the auxiliary storage capacitor Cst'. In some embodiments, the second gate electrode G2 may be a second lower electrode CE1' of the auxiliary storage capacitor Cst'. In other embodiments, the second lower electrode CE1' of the auxiliary storage capacitor Cst' may be an independent component that is separate from the second gate electrode G2 of the auxiliary thin-film transistor TFT'.

The first upper electrode CE2 and the second upper electrode CE2' may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may be a single layer or multilayer including one or more of the aforementioned materials.

The third insulating layer 115 may be provided to cover the first upper electrode CE2 and the second upper electrode CE2'. The third insulating layer 115 may include an inorganic insulating material such as silicon oxide ($SiO_x$), silicon nitride $SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$).

A data line DL, the source electrodes S1 and S2, and the drain electrodes D1 and D2 may be above the third insulating layer 115. The data line DL, the source electrodes S1 and S2, and the drain electrodes D1 and D2 may each include a conductive material including Mo, Al, Cu, or Ti, and may form a single layer or multiple layers including one or more of the above materials. For example, the data line DL, the source electrodes S1 and S2, and the drain electrodes D1 and D2 may have a multilayer structure of Ti/Al/Ti.

The first planarization layer 117 may be arranged to cover the data line DL, the source electrodes S1 and S2, and the drain electrodes D1 and D2. The first planarization layer 117 may include an organic material or an inorganic material and may have a single layer structure or a multilayer structure. The first planarization layer 117 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or the like. The first planarization layer 117 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). After the first planarization layer 117 is formed, chemical and mechanical polishing may be performed on the layer to provide a flat upper surface.

A second planarization layer 118 may be above the first planarization layer 117. The second planarization layer 118 may have a flat upper surface so that a first pixel electrode 121 and a second pixel electrode 121' arranged thereabove may be formed to be substantially flat. In some embodiments, the second planarization layer 118 may include the same material as the first planarization layer 117. In other embodiments, the second planarization layer 118 may include a material that is different from a material of the first planarization layer 117. The inclusion of the second planarization layer 118 above the first planarization layer 117 may be advantageous or suitable for high integration.

Contact electrodes CM and CM' may be above the first planarization layer 117. The first pixel electrode 121 and the second pixel electrode 121' may be electrically connected to the main thin-film transistor TFT and the auxiliary thin-film transistor TFT', respectively, through the contact electrodes CM and CM' arranged above the first planarization layer 117, respectively.

The first pixel electrode 121 and the second pixel electrode 121' may include a conductive oxide such as indium tin oxide (ITO), indium zinc oxide (IZO), zinc oxide (ZnO), indium oxide ($In_2O_3$), indium gallium oxide (IGO), and aluminum zinc oxide (AZO). The first pixel electrode 121 and the second pixel electrode 121' may each include a reflective layer including Ag, Mg, Al, Pt, Pd, Au, Ni, Nd, Ir, Cr, or a compound thereof. For example, the first pixel electrode 121 and the second pixel electrode 121' may each have a structure in which films formed of ITO, IZO, ZnO, or $In_2O_3$ are above or below the aforementioned reflection layer. In this case, the first pixel electrode 121 and the second pixel electrode 121' may have a structure in which ITO/Ag/ITO are sequentially stacked.

A pixel-defining layer 119, which may be above the second planarization layer 118, may cover an edge of each of the first pixel electrode 121 and the second pixel electrode 121', and may include a first opening OP1 and a second opening OP2 exposing at least a portion of the first pixel electrode 121 and the second pixel electrode 121', respectively. The sizes and shapes of light-emission areas of the organic light-emitting diodes OLED and OLED', namely, the subpixels Pm and Pa, may be defined by the first opening OP1 and the second opening OP2.

The pixel-defining layer 119 may reduce or prevent the likelihood of an electric arc or the like occurring on the edges of the pixel electrodes 121 and 121' by increasing distances between the edges of the pixel electrodes 121 and 121' and the opposite electrode 123 above the pixel electrodes 121 and 121'. The pixel-defining layer 119 may include an organic insulating material such as PI, polyamide, acrylic resin, BCB, HMDSO, and phenolic resin, and may be formed by spin coating or the like. In other embodiments a spacer may be further provided above the pixel-defining layer 119.

Inside the first opening OP1 and the second opening OP2 of the pixel-defining layer 119, a first emission layer 122b and a second emission layer 122b' may be arranged to correspond to the first pixel electrode 121 and the second pixel electrode 121', respectively. The first emission layer 122b and the second emission layer 122b' may each include a polymer organic material or a low molecular weight inorganic material, and may emit red, green, blue, or white light.

An organic functional layer 122e may be above and/or below the first emission layer 122b and the second emission layer 122b'. The organic functional layer 122e may include a first functional layer 122a and/or a second functional layer 122c. The first functional layer 122a or the second functional layer 122c may be omitted in other embodiments.

The first functional layer 122a may be below the first emission layer 122b and the second emission layer 122b'. The first functional layer 122a may be a single layer or multiple layers including organic materials. The first functional layer 122a may be a hole transport layer (HTL) having a single layer structure. Alternatively, the first functional layer 122a may include a hole injection layer (HIL) and the HTL. The first functional layer 122a may be integrally provided to correspond to the main and auxiliary organic light-emitting diodes OLED and OLED' respectively included in the main display area MDA and the component area CA.

The second functional layer 122c may be above the first emission layer 122b and the second emission layer 122b'. The second functional layer 122c may be a single layer or multiple layers including organic materials. The second functional layer 122c may include an electron transport layer (ETL) and/or an electron injection layer (EIL). The second functional layer 122c may be integrally provided to correspond to the organic light-emitting diodes OLED and OLED' respectively included in the main display area MDA and the component area CA.

The opposite electrode 123 may be above the second functional layer 122c. The opposite electrode 123 may include a conductive material having a low work function. For example, the opposite electrode 123 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy of those materials. Alternatively, the opposite electrode 123 may further include a layer such as ITO, IZO, ZnO, or $In_2O_3$ on the (semi)transparent layer including any of the above-described materials. The opposite electrode 123 may be integrally provided to correspond to the organic light-emitting diodes OLED and OLED' respectively included in the main display area MDA and the component area CA.

Layers from the first pixel electrode 121 to the opposite electrode 123 in the main display area MDA may form the main organic light-emitting diode OLED. Layers from the second pixel electrode 121' to the opposite electrode 123 in the component area CA may form the auxiliary organic light-emitting diode OLED'.

In other embodiments, a capping layer including an organic material may be formed above the opposite electrode 123. The capping layer may be provided to protect the opposite electrode 123 and may also increase light extraction efficiency. The capping layer may include an organic material having a higher refractive index than the opposite electrode 123.

The thin-film encapsulation layer TFEL may be arranged above the display element layer EDL of display panel 10 as a sealing member. That is, the organic light-emitting diodes OLED and OLED' may be sealed by the thin-film encapsulation layer TFEL. The thin-film encapsulation layer TFEL may be above the opposite electrode 123. The thin-film encapsulation layer TFEL may reduce or prevent the penetration of external moisture or foreign substances into the organic light-emitting diodes OLED and OLED'.

The thin-film encapsulation layer TFEL may include at least one inorganic film layer and at least one organic film layer. In this regard, FIG. 9 shows a structure in which a first inorganic film layer 131, an organic film layer 132, and a second inorganic film layer 133 are stacked. In other embodiments, the number of organic film layers, the number of inorganic film layers, and a stacking order may be changed.

The first inorganic film layer 131 and the second inorganic film layer 133 may each include at least one inorganic insulating material such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide ($ZnO_2$), and may be formed by a chemical vapor deposition (CVD) or the like. The organic film layer 132 may include a polymer-based material. Examples of the polymer-based material may include silicone resin, acrylic resin, epoxy resin, polyimide, polyethylene, or the like.

The first inorganic film layer 131, the organic film layer 132, and the second inorganic film layer 133 may be integrally formed to cover the main display area MDA and the component area CA.

Figure 10:
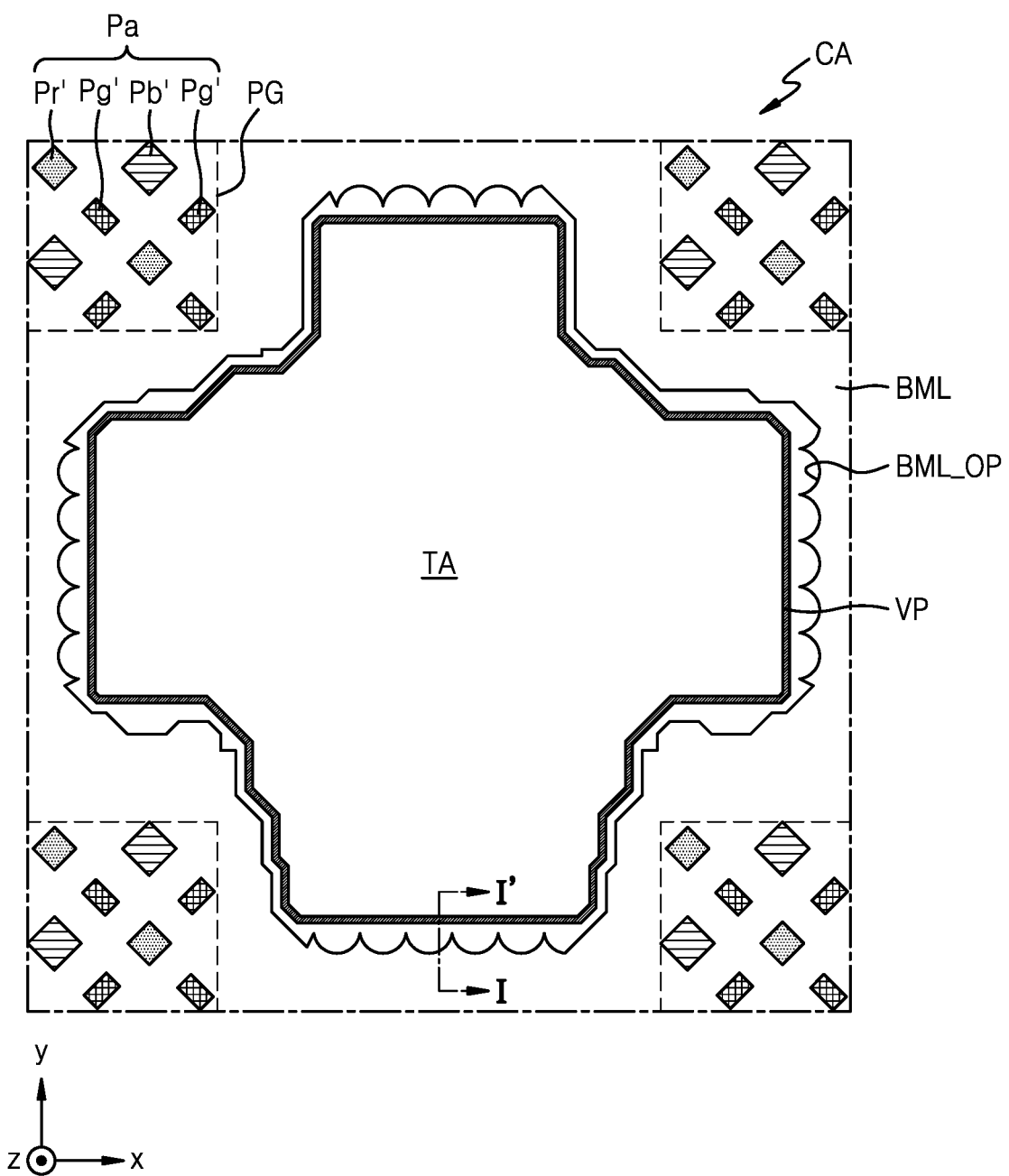
FIG. 10 is a layout view illustrating a portion of a display panel and a component area according to some embodiments.
Figure 11:
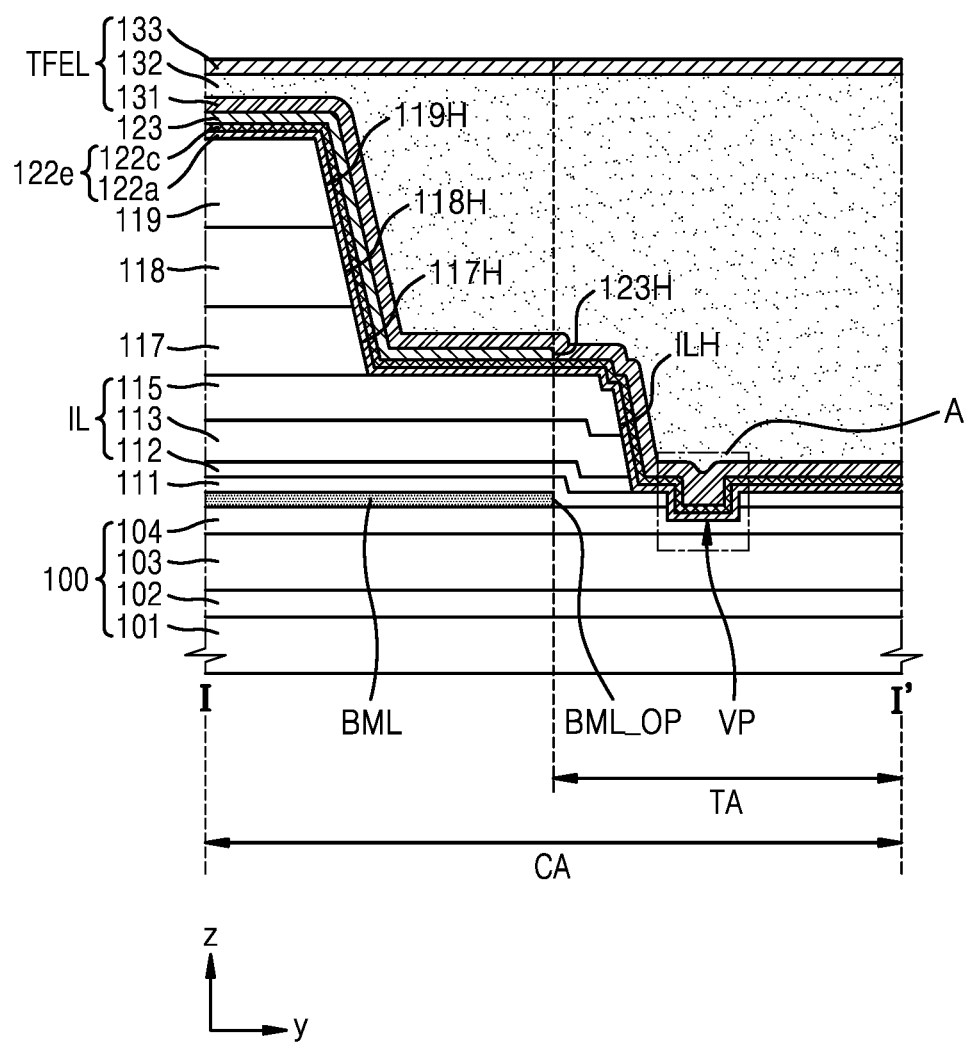
FIG. 11 is a cross-sectional view illustrating a portion of a display panel and a component area according to some embodiments.
Figure 12:
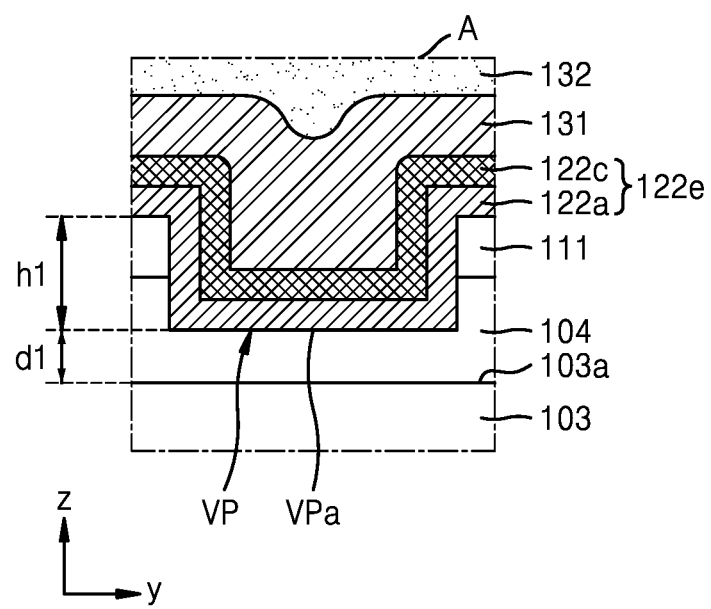
FIG. 12 is an enlarged view of region A of FIG. 11 according to some embodiments.

FIG. 10 is a layout view illustrating a portion of a display panel and a component area according to some embodiments, FIG. 11 is a cross-sectional view illustrating a portion of a display panel and a component area according to some embodiments, and FIG. 12 is an enlarged view of region A of FIG. 11.

Referring to FIG. 10, auxiliary subpixels Pa may be in the component area CA. The component area CA may include a transmissive area TA. The auxiliary subpixels Pa may be arranged around the transmissive area TA. The auxiliary subpixels Pa may be around the transmissive area TA in units of a pixel group PG.

The transmissive area TA may be between the pixel groups PG. For example, the transmissive area TA may be between two pixel groups PG that are adjacent to each other (e.g., in the x direction, the y direction, or a direction oblique to the x and y directions).

As shown in FIG. 10, the transmissive area TA may have an approximately cross shape, and may have a structure in which the edge thereof has irregularities. In other embodiments, the transmissive area TA may have a structure having an overall circular (or oval or polygonal) shape and an uneven edge.

The bottom metal layer BML may be above the component area CA excluding the transmissive area TA. The bottom metal layer BML may include an opening BML_OP corresponding to the transmissive area TA. The opening BML_OP defined by the bottom metal layer BML may have an overall cross shape.

A valley portion VP may be at the boundary between the bottom metal layer BML and the transmissive area TA. The valley portion VP may be adjacent to the boundary between the bottom metal layer BML and the transmissive area TA. For example, the valley portion VP may be formed along the edge of the bottom metal layer BML, and may be above the transmissive area TA.

Referring to FIG. 11, a component area CA may include a transmissive area TA. A substrate 100, a buffer layer 111, an inorganic insulating layer IL, a first planarization layer 117, a second planarization layer 118, a pixel-defining layer 119, and a thin-film encapsulation layer TFEL may be above the component area CA. The substrate 100 may include a first base layer 101, a first barrier layer 102, a second base layer 103, and a second barrier layer 104. The inorganic insulating layer IL may include a first insulating layer 112, a second insulating layer 113, and a third insulating layer 115. The thin-film encapsulation layer TFEL may include a first inorganic film layer 131, an organic film layer 132, and a second inorganic film layer 133.

In the component area CA, a bottom metal layer BML may be between the substrate 100 and the buffer layer 111. The bottom metal layer BML might not be present in the transmissive area TA. By not providing the bottom metal layer BML above the transmissive area TA, the light transmittance of the transmissive area TA may be improved.

The bottom metal layer BML may include an opening BML_OP corresponding to the transmissive area TA. For example, the transmissive area TA may be defined by the opening BML_OP in the bottom metal layer BML.

The inorganic insulating layer IL, the first planarization layer 117, the second planarization layer 118, and the pixel-defining layer 119 above the substrate 100 may each include a hole corresponding to the transmissive area TA. The inorganic insulating layer IL may have a first hole ILH corresponding to the transmissive area TA. That the first hole ILH corresponds to the transmissive area TA may be understood that the first hole ILH overlaps the transmissive area TA. The first hole ILH may expose at least a portion of the upper surface of the buffer layer 111 or the substrate 100. The first hole ILH may be a result of overlapping of an opening of the first insulating layer 112, an opening of the second insulating layer 113, and an opening of the third insulating layer 115 that correspond to the transmissive area TA. These openings may be individually formed through separate processes, or may be simultaneously formed through the same process. When these openings are formed through separate processes, the inner surface of the first hole ILH might not be smooth and may have steps such as a staircase shape.

The first planarization layer 117 may have a second hole 117H corresponding to the transmissive area TA. That the second hole 117H corresponds to the transmissive area TA may be understood that the second hole 117H overlaps the transmissive area TA. The second hole 117H may overlap the first hole ILH. FIG. 11 illustrates the second hole 117H that is larger than the first hole ILH. According to other embodiments, the first planarization layer 117 may cover the edges of the first hole ILH of the inorganic insulating layer IL, and the second hole 117H may have a smaller area than the first hole ILH.

The second planarization layer 118 may have a third hole 118H corresponding to the transmissive area TA. That the third hole 118H corresponds to the transmissive area TA may be understood that the third hole 118H overlaps the transmissive area TA. The third hole 118H may overlap the first hole ILH and the second hole 117H. FIG. 11 illustrates the second hole 117H that is larger than the first hole ILH and the second hole 117H. In other embodiments, the second planarization layer 118 is provided to cover the edge of the first hole ILH of the inorganic insulating layer IL or the edge of the second hole 117H of the first planarization layer 117, and the area of the third hole 118H may be formed smaller than the area of the first hole ILH or the area of the second hole 117H.

The pixel-defining layer 119 may include a fourth hole 119H corresponding to the transmissive area TA. That the fourth hole 119H corresponds to the transmissive area TA may be understood that the fourth hole 119H overlaps the transmissive area TA. The fourth hole 119H may overlap the first hole ILH, the second hole 117H, and the third hole 118H. Because the first hole ILH to the fourth hole 119H are defined to correspond to the transmissive area TA, the light transmittance in the transmissive area TA may be improved. A portion of the organic functional layer 122e and the opposite electrode 123 described above may be on the inner surfaces of the first hole ILH to the fourth hole 119H.

The opposite electrode 123 may include a fifth hole 123H corresponding to the transmissive area TA. That the fifth hole 123H corresponds to the transmissive area TA may be understood that the fifth hole 123H overlaps the transmissive area TA. In FIG. 11, an area of the fifth hole 123H is provided larger than an area of the first hole ILH formed in the inorganic insulating layer IL. However, the present disclosure is not limited thereto. In other embodiments, an area of the fifth hole 123H may be provided to be smaller than or equal to an area of the first hole ILH.

Due to the fifth hole 123H, a portion of the opposite electrode 123 is not present in the transmissive area TA, and the light transmittance in the transmissive area TA may be significantly improved. The opposite electrode 123 with the fifth hole 123H may be formed in various ways. According to some embodiments, after a material used to form the opposite electrode 123 is deposited on the entire surface of the substrate 100, a portion of the deposited material that corresponds to the transmission area TA is removed via laser lift off, and thus, the opposite electrode 123 having the fifth hole 123H may be formed. According to other embodiments, the opposite electrode 123 having the fifth hole 123H may be formed by metal self patterning (MSP). According to other embodiments, the opposite electrode 123 having the fifth hole 123H may be formed via a deposition method using a fine metal mask (FMM).

A valley portion VP may be at the boundary between the bottom metal layer BML and the transmissive area TA. The valley portion VP may be adjacent to the boundary between the bottom metal layer BML and the transmissive area TA. For example, the valley portion VP is formed along the edge of the bottom metal layer BML, and may be above the transmissive area TA.

The valley portion VP may be above a second barrier layer 104. The valley portion VP may be formed by etching at least a portion of the second barrier layer 104 and the buffer layer 111 by a dry etching process. Therefore, the valley portion VP may be above the second base layer 103. In the valley portion VP, the first functional layer 122a that is of an organic functional layer 122e, and the second functional layer 122c may be arranged. In addition, the thin-film encapsulation layer TFEL or a portion thereof may be in the valley portion VP. For example, the first inorganic film layer 131 and/or the organic film layer 132 may be in the valley portion VP.

In the case of the opposite electrode 123, after the opposite electrode 123 is formed on the entire display panel, a portion thereof corresponding to the transmissive area TA may be removed via laser lift-off. In this case, the upper interface of the organic functional layer 122e may be damaged by heat, the adhesion between the organic functional layer 122e and the thin-film encapsulation layer TFEL (e.g., the first inorganic film layer 131) may decrease, as the opposite electrode 123 remains above the organic functional layer 122e, or as the organic functional layer 122e and the thin-film encapsulation layer TFEL (for example, the first inorganic film layer 131) may be peeled off due to the step difference between the bottom metal layer BML and the transmissive area TA.

In some embodiments, by providing the valley portion VP in a position that is adjacent to the boundary between the bottom metal layer BML and the transmissive area TA, the adhesion between the organic functional layer 122e and the thin-film encapsulation layer TFEL (for example, the first inorganic film layer 131) may be improved, and thus, the likelihood of the organic functional layer 122e and the thin-film encapsulation layer TFEL (for example, the first inorganic film layer 131) being peeled off or separating may be reduced or prevented.

Referring to FIG. 12, the valley portion VP may be formed by etching at least a portion of the second barrier layer 104 and the buffer layer 111. The valley portion VP may be provided with a height h1 of about 2,000 angstroms (Å) or more and about 8,000 angstroms (Å) or less from the second barrier layer 104 that is provided by removing at least a portion thereof (e.g., by etching). For example, the valley portion VP may be provided with a height h1 of about 5,000 angstroms (Å) or more and about 7,000 angstroms (Å) or less from the second barrier layer 104 that is provided by removing at least a portion thereof by etching.

The first inorganic film layer 131 may be provided with a given thickness or more to protect the organic light-emitting diodes OLED and OLED' from external moisture or foreign substances. Due to the thickness of the first inorganic film layer 131, when at least a portion of the valley portion VP has a height h1 of less than about 2,000 angstroms (Å) from the second barrier layer 104 that is provided by removing the second barrier layer 104 by etching, it may be difficult to achieve the purpose of improving the adhesion of the organic functional layer 122e and the thin-film encapsulation layer TFEL (for example, the first inorganic film layer 131).

In addition, the second barrier layer 104 is above the second base layer 103 to reduce or block the penetration of foreign matter, moisture, or ambient air from the bottom, and when the second barrier layer 104 is thin, there may be cases where the display panel is damaged. When the valley portion VP is provided with a height h1 of more than about 8,000 angstroms (Å) from the second barrier layer 104 that is provided by removing at least a portion of the valley portion, a thickness of the second barrier layer 104 between the second base layer 103 and the valley portion VP decreases, and there may be cases in which the display panel is damaged by foreign matter, moisture, or ambient air.

Therefore, when the valley portion VP is provided with a height h1 of about 2,000 angstroms (Å) or more and about 8,000 angstroms (Å) or less from the second barrier layer 104 that is provided by removing at least a portion of the valley portion VP, the adhesion of the organic functional layer 122e and the thin-film encapsulation layer TFEL (for example, the first inorganic film layer 131) is improved, and thus, the organic functional layer 122e and the thin-film encapsulation layer TFEL (for example, the first inorganic film layer 131) may be prevented from being peeled off.

However, when the valley portion VP is provided high from the second barrier layer 104 that is provided by removing at least a portion of the valley portion VP by etching, a contact area between the organic functional layer 122e and the thin-film encapsulation layer TFEL (for example, the first inorganic film layer 131) increases, and the adhesion between the organic functional layer 122e and the thin-film encapsulation layer TFEL (for example, the first inorganic film layer 131) may be further improved, and thus, for example, the valley portion VP may be provided with a height h1 of about 5,000 angstroms (Å) or more and about 7,000 angstroms (Å) or less from the second barrier layer 104 that is provided by removing at least a portion of the valley portion VP by etching.

The second base layer 103 and the valley portion VP may be apart from each other by a preset interval to reduce or block the penetration of foreign matter, moisture, or ambient air from the bottom. A lower surface VPa of the valley portion VP and an upper surface 103a of the second base layer 103 may be apart by a distance d1 of about 2,000 angstroms (Å) or more. For example, the lower surface VPa of the valley portion VP and the upper surface 103a of the second base layer 103 may be apart by a distance d1 of about 5,000 angstroms (Å) or less.

FIGS. 10 to 12 illustrate that one valley portion VP is provided adjacent to the boundary between the bottom metal layer BML and the transmissive area TA, but the present disclosure is not limited thereto. For example, two or more valley portions VP may be provided in an area adjacent to the boundary between the bottom metal layer BML and the transmissive area TA.

Figure 13:
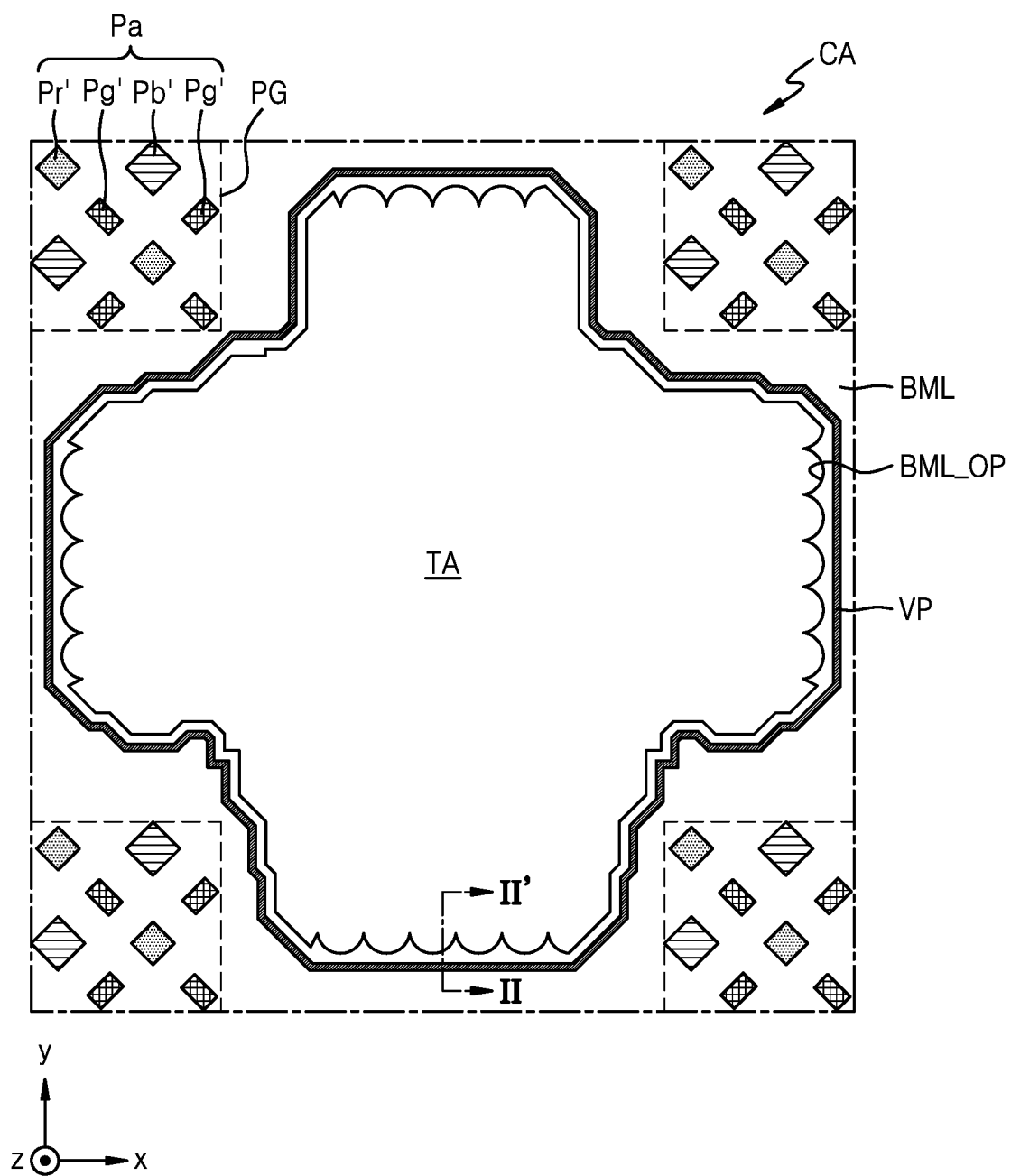
FIG. 13 is a layout view illustrating a portion of a display panel and a component area according to some embodiments.
Figure 14:
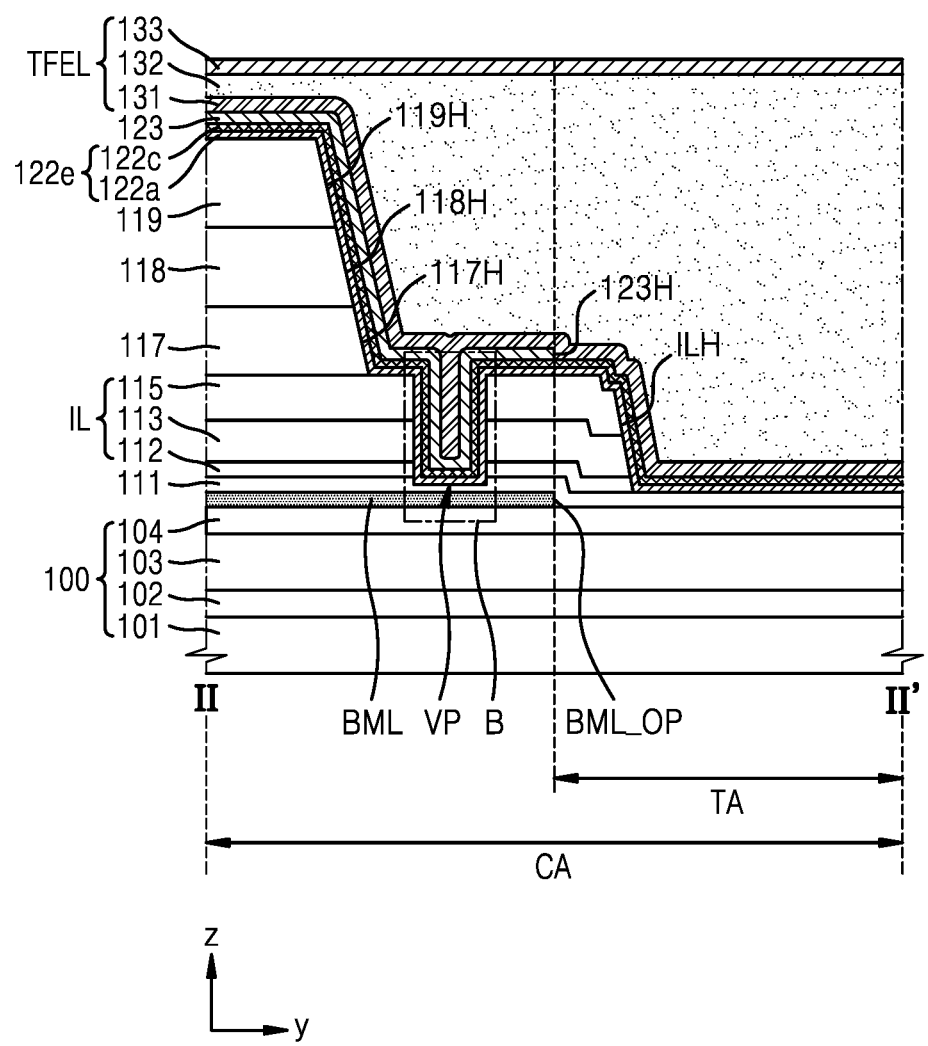
FIG. 14 is a cross-sectional view illustrating a portion of a display panel and a component area according to some embodiments.
Figure 15:
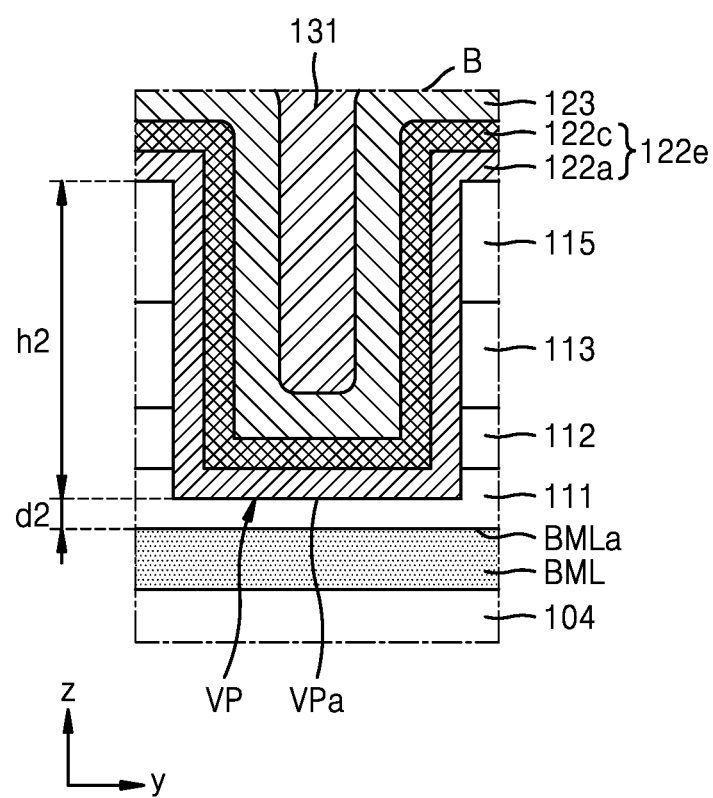
FIG. 15 is an enlarged view of region B of FIG. 14 according to some embodiments.

FIG. 13 is a layout view illustrating a portion of a display panel and a component area according to some embodiments, FIG. 14 is a cross-sectional view illustrating a portion of a display panel and a component area according to some embodiments, and FIG. 15 is an enlarged view of region B of FIG. 14. The embodiments of FIGS. 13 to 15 are different from the embodiments of FIGS. 10 to 12 in that the valley portion VP at least partially overlaps the bottom metal layer BML. In FIGS. 13 to 15, the same reference numerals as those of FIGS. 10 to 12 denote the same member, and redundant descriptions thereof will be omitted.

Referring to FIGS. 13 and 14, the valley portion VP may be at the boundary between the bottom metal layer BML and the transmissive area TA. The valley portion VP may be adjacent to the boundary between the bottom metal layer BML and the transmissive area TA. The valley portion VP may be arranged to at least partially overlap the bottom metal layer BML.

The valley portion VP may be above a buffer layer 111. The valley portion VP may be formed by etching at least a portion of the buffer layer 111 and the inorganic insulating layer IL by a dry etching process. For example, at least a portion of the buffer layer 111, the first insulating layer 112, the second insulating layer 113, and the third insulating layer 115 may be etched by a dry etching process to form the valley portion VP. Therefore, the valley portion VP may be above the bottom metal layer BML.

In the valley portion VP, the first functional layer 122a that is of an organic functional layer 122e, and the second functional layer 122c may be arranged. Because the valley portion VP at least partially overlaps the bottom metal layer BML, the opposite electrode 123 may be within the valley portion VP. In addition, the thin-film encapsulation layer TFEL or a portion thereof may be in the valley portion VP. For example, the first inorganic film layer 131 and/or the organic film layer 132 may be in the valley portion VP.

In some embodiments, by providing the valley portion VP at least partially overlapping the bottom metal layer BML at a position adjacent to the boundary between the bottom metal layer BML and the transmissive area TA, the likelihood of the thin-film encapsulation layer TFEL (for example, the first inorganic film layer 131) peeling off may be reduced or prevented.

Referring to FIG. 15, at least a portion of the buffer layer 111, the first insulating layer 112, the second insulating layer 113, and the third insulating layer 115 may be etched to form the valley portion VP. The valley portion VP may be provided with a height h2 of about 2,000 angstroms (Å) or more and about 10,000 angstroms (Å) or less from the buffer layer 111 that is provided by removing at least a portion of the valley portion VP by etching.

However, when the valley portion VP is provided relatively high from the buffer layer 111 by removing at least a portion corresponding to the valley portion VP by etching, a contact area between the organic functional layer 122e and the thin-film encapsulation layer TFEL (for example, the first inorganic film layer 131) increases, and the adhesion between the organic functional layer 122e and the thin-film encapsulation layer TFEL (for example, the first inorganic film layer 131) may further improved, and thus, for example, the valley portion VP may be provided with a height h2 of about 5,000 angstroms (Å) or more and about 10,000 angstroms (Å) or less from the buffer layer 111 that is provided while removing a portion thereof.

When the bottom metal layer BML and the valley portion VP are arranged adjacent to each other, a short circuit may occur in the bottom metal layer BML due to the organic functional layer 122e and/or the opposite electrode 123 in the valley portion VP. Accordingly, to reduce or prevent the likelihood of a short circuit occurring in the bottom metal layer BML, the bottom metal layer BML and the valley portion VP may be apart from each other (e.g., at a preset interval).

The lower surface VPa of the valley portion VP and an upper surface BMLa of the bottom metal layer BML may be apart by a distance d2 of about 1,000 angstroms (Å) or more. For example, the lower surface VPa of the valley portion VP and an upper surface BMLa of the bottom metal layer BML may be apart by a distance d2 of about 1,000 angstroms (Å) or more and about 5,000 angstroms (Å) or less.

FIGS. 13 to 15 illustrate that one valley portion VP is provided adjacent to the boundary between the bottom metal layer BML and the transmissive area TA, but the present disclosure is not limited thereto. In other embodiments, two or more valley portions VP may be provided in an area adjacent to the boundary between the bottom metal layer BML and the transmissive area TA.

Figure 16:
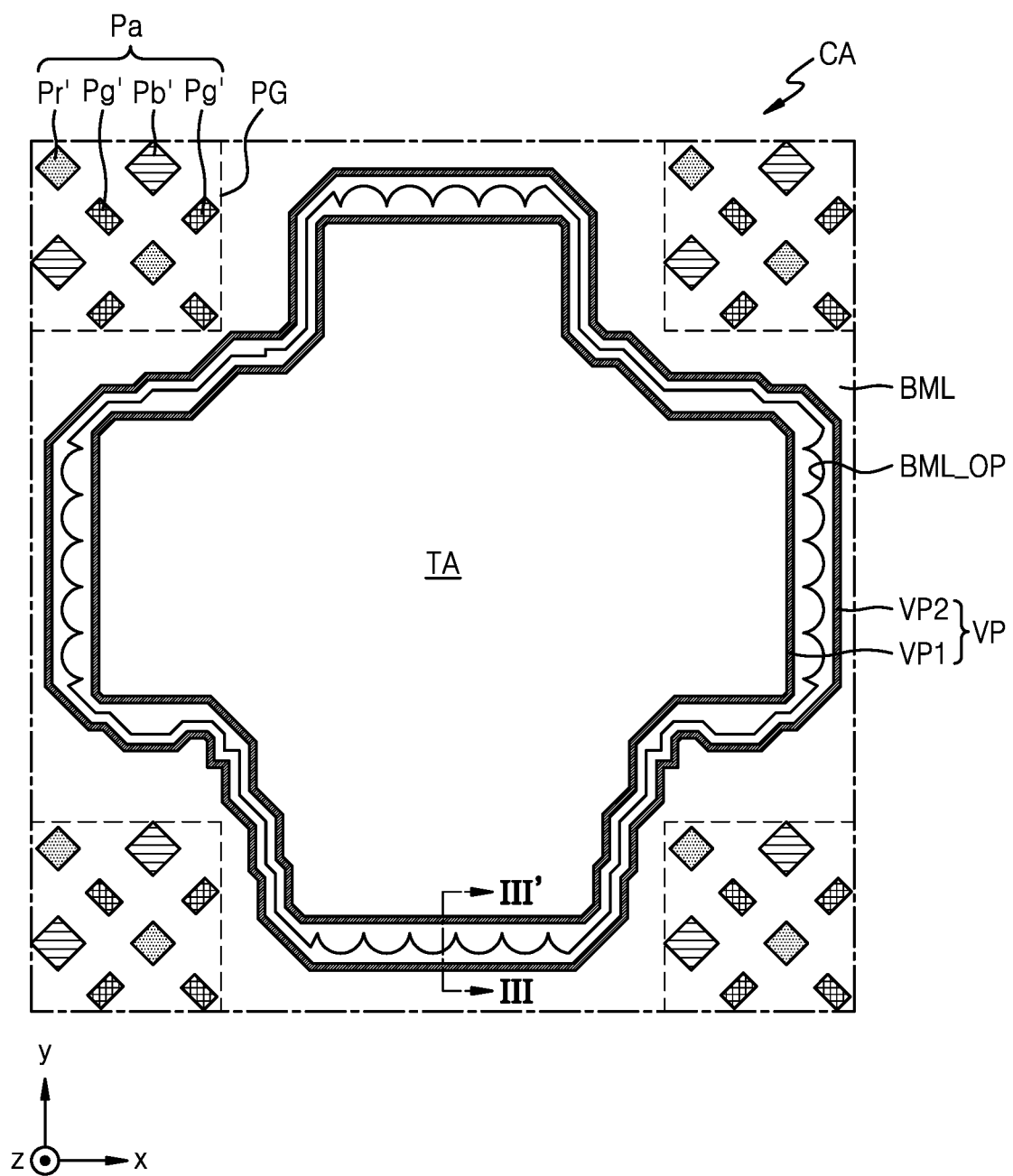
FIG. 16 is a layout view illustrating a portion of a display panel and a component area, according to some embodiments.
Figure 17:
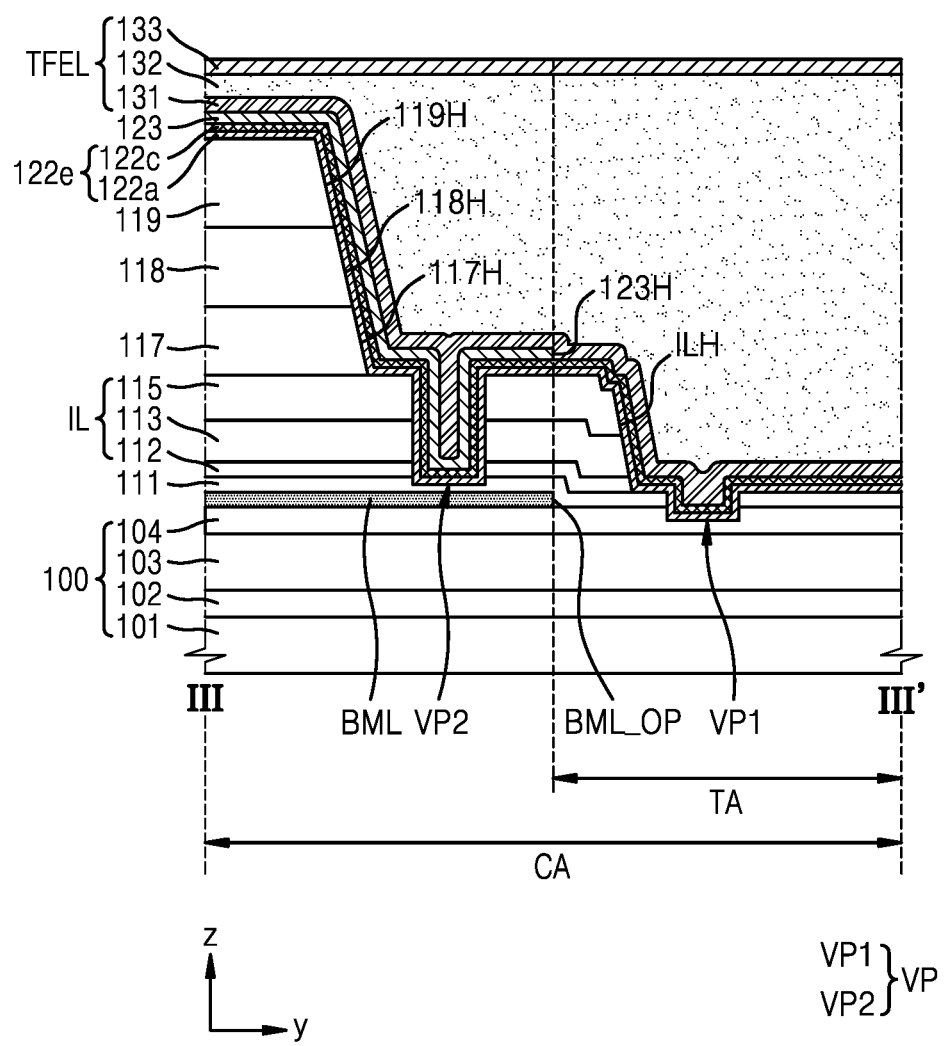
FIG. 17 is a cross-sectional view illustrating a portion of a display panel and a component area, according to some embodiments.

FIG. 16 is a layout view illustrating a portion of a display panel and a component area according to some embodiments, and FIG. 17 is a cross-sectional view illustrating a portion of a display panel and a component area according to some embodiments. The embodiments of FIGS. 16 and 17 are different from the embodiments of FIGS. 10 to 15 in that the valley portion VP includes a first valley portion VP1 and a second valley portion VP2. In FIGS. 16 and 17, the same reference numerals as those of FIGS. 10 to 15 denote the same member, and redundant descriptions thereof will be omitted.

Referring to FIGS. 16 and 17, the valley portion VP may be at the boundary between the bottom metal layer BML and the transmissive area TA. The valley portion VP may be adjacent to the boundary between the bottom metal layer BML and the transmissive area TA. The valley portion VP may include the first valley portion VP1 and the second valley portion VP2. The first valley portion VP1 may be formed along the edge of the bottom metal layer BML and arranged on the transmissive area TA, and the second valley portion VP2 may be arranged to at least partially overlap the bottom metal layer BML.

The first valley portion VP1 may be above the second barrier layer 104. The first valley portion VP1 may be formed by etching at least a portion of the second barrier layer 104 and the buffer layer 111 by a dry etching process. Therefore, the first valley portion VP1 may be above the second base layer 103. In the first valley portion VP1, the first functional layer 122a that is of an organic functional layer 122e, and the second functional layer 122c may be arranged. In addition, the thin-film encapsulation layer TFEL or a portion thereof may be in the first valley portion VP1. For example, the first inorganic film layer 131 and/or the organic film layer 132 may be in the first valley portion VP1.

The second valley portion VP2 may be above a buffer layer 111. The second valley portion VP2 may be formed by etching at least a portion of the buffer layer 111 and the inorganic insulating layer IL by a dry etching process. For example, at least a portion of the buffer layer 111, the first insulating layer 112, the second insulating layer 113, and the third insulating layer 115 may be etched (e.g., by a dry etching process) to form the second valley portion VP2. Therefore, the second valley portion VP2 may be above the bottom metal layer BML.

In the second valley portion VP2, the first functional layer 122a that is of an organic functional layer 122e, and the second functional layer 122c may be arranged. Because the second valley portion VP2 at least partially overlaps the bottom metal layer BML, the opposite electrode 123 may be within the second valley portion VP2. In addition, the thin-film encapsulation layer TFEL or a portion thereof may be in the second valley portion VP2. For example, the first inorganic film layer 131 and/or the organic film layer 132 may be in the second valley portion VP2.

By providing the first valley portion VP1 and the second valley portion VP2 adjacent to the boundary between the bottom metal layer BML and the transmissive area TA, the adhesion between the organic functional layer 122e and the thin-film encapsulation layer TFEL (for example, the first inorganic film layer 131) is improved, and thus, the likelihood of the organic functional layer 122e and the thin-film encapsulation layer TFEL (for example, the first inorganic film layer 131) being peeled off may be reduced or prevented.

Figure 18:
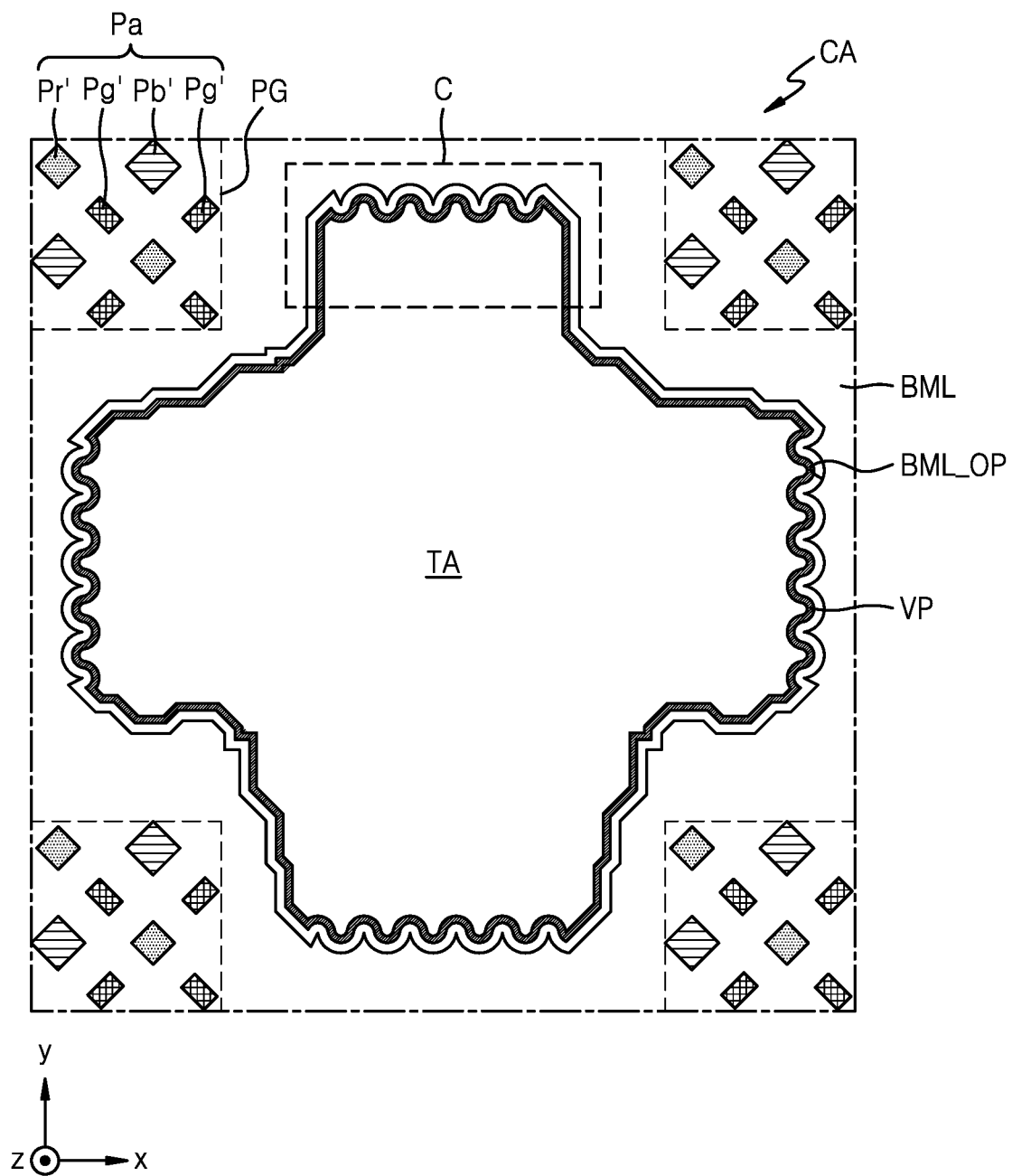
FIG. 18 is a layout view illustrating a portion of a display panel and a plan view of a component area, according to some embodiments.
Figure 19:
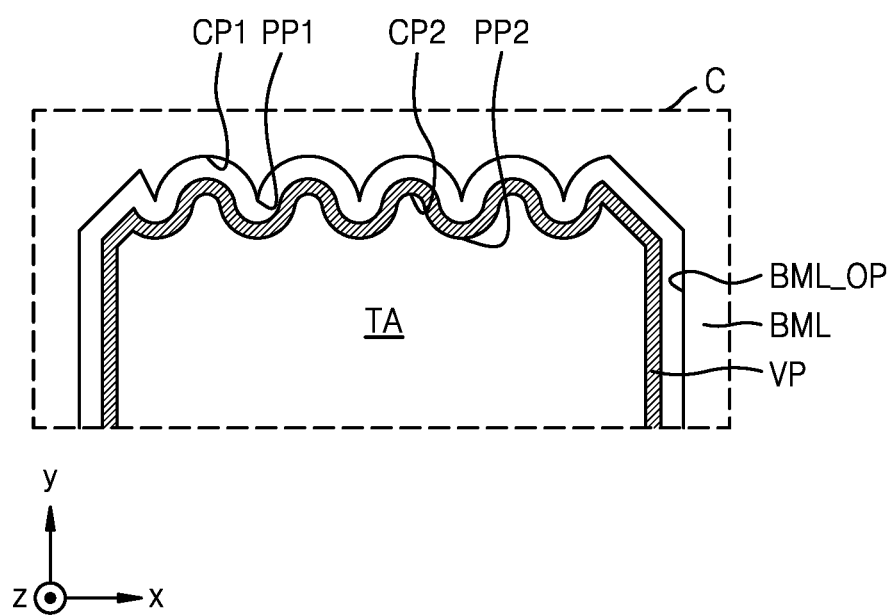
FIG. 19 is an enlarged view of region C of FIG. 18 according to some embodiments.

FIG. 18 is a layout view illustrating a portion of a display panel and a component area, and FIG. 19 is an enlarged view of region C of FIG. 18. The embodiment of FIG. 18 is different from the embodiment of FIG. 10 in that the valley portion VP has an uneven structure. In FIG. 18, the same reference numerals as those of FIG. 10 denote the same member, and redundant descriptions thereof will be omitted.

Referring to FIGS. 18 and 19, the bottom metal layer BML may include an opening BML_OP corresponding to the transmissive area TA. An edge of the bottom metal layer BML defining the opening BML_OP that corresponds to the transmissive area TA may include a first convex portion CP1. The edge of the bottom metal layer BML may include a structure in which the first convex portion CP1 is continuously and/or regularly arranged, and a first concave portion PP1 oriented toward the center of the opening BML_OP may be provided between adjacent first convex portions CP1. The first concave portion PP1 may have a relatively sharp shape as shown in FIG. 19, and may have a relatively round shape in other embodiments.

The first convex portion CP1 may have a semicircular shape. As other embodiments, the first convex portion CP1 may have various shapes, such as substantially semi-elliptical shape, approximately triangular shape, or approximately square shape.

When the edge of the bottom metal layer BML includes the first convex portion CP1, diffraction of light traveling to a component through an opening BML-OP may be reduced or minimized, and thus, a resolution of light received by the component may be sufficiently secured.

The valley portion VP may be at the boundary between the bottom metal layer BML and the transmissive area TA. For example, the valley portion VP may be adjacent to the boundary between the bottom metal layer BML and the transmissive area TA. The valley portion VP is formed along the edge of the bottom metal layer BML and may be above the transmissive area TA.

The valley portion VP may include a second convex portion CP2 corresponding to the first convex portion CP1 provided at the edge of the bottom metal layer BML. A shape of the second convex portion CP2 provided in the valley portion VP may correspond to a shape of the first convex portion CP1 provided at an edge of the bottom metal layer BML. For example, the shape of the second convex portion CP2 provided in the valley portion VP may be identical or similar to the shape of the first convex portion CP1 provided at the edge of the bottom metal layer BML.

A second concave portion PP2 may be provided between the second convex portions CP2 provided in the valley portion VP. A shape of the second concave portion PP2 may correspond to the shape of the first concave portion PP1 provided at the edge of the bottom metal layer BML, as in the case of the second concave portion PP2. For example, the shape of the second concave portion PP2 may be identical or similar to the shape of the first concave portion PP1 provided at the edge of the bottom metal layer BML.

When the valley portion VP includes the second convex portions CP2, diffraction of light traveling to the component may be reduced or minimized, and thus, resolution of light received by the component may be sufficiently secured.

Figure 20:
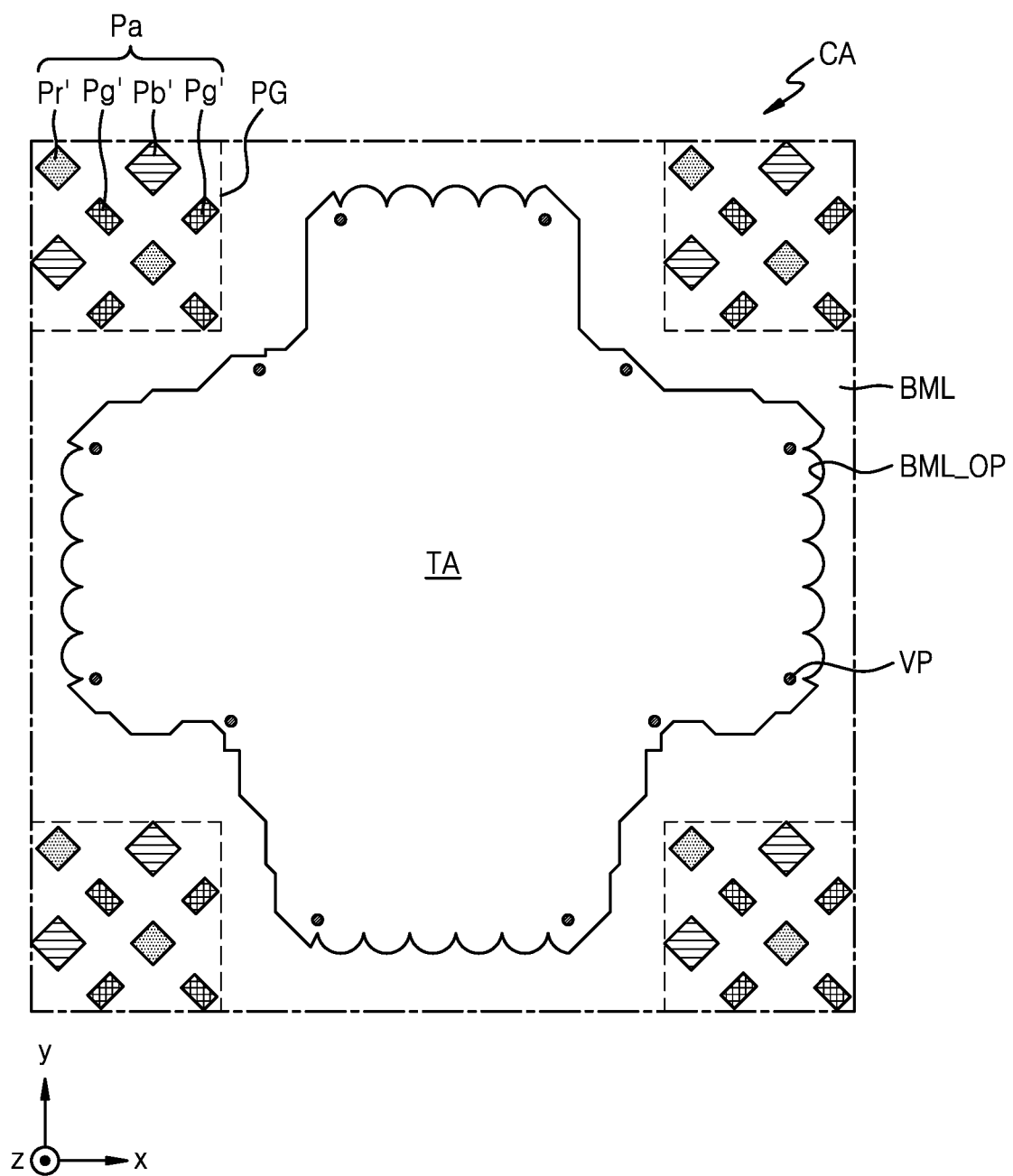
FIG. 20 is a layout view illustrating a portion of a display panel, and a plan view of a component area, according to some embodiments.

FIG. 20 is a layout view illustrating a portion of a display panel and a component area according to some embodiments. The embodiment of FIG. 20 is different from the embodiment of FIG. 10 in that the valley portion VP has an isolated shape. In FIG. 20, the same reference numerals as those of FIG. 10 denote the same member, and redundant descriptions thereof will be omitted.

Referring to FIG. 20, the valley portion VP may be at the boundary between the bottom metal layer BML and the transmissive area TA. For example, the valley portion VP may be adjacent to the boundary between the bottom metal layer BML and the transmissive area TA. The valley portion VP may be above the transmissive area TA and may have an isolated shape. That is, the valley portion VP might not be provided integrally, but may be provided in plural and in an isolated shape by being apart from each other.

In FIG. 20, the valley portion VP is shown to have a dotted or circular shape, but the present disclosure is not limited thereto. The valley portion VP may be provided in various shapes such as a shape in which lines are apart from each other, and in which ellipses are apart from each other.

As described above, the display panel according to some embodiments and the display device including the display panel may include a valley portion that is adjacent to the boundary between the bottom metal layer and the transmissive area, thereby reducing or preventing the likelihood of a thin-film encapsulation layer being peeled off.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display panel comprising:
   a main display area;
   a component area having a transmissive area;
   a peripheral area outside the main display area;
   a substrate;
   a bottom metal layer on the substrate, and defining an opening corresponding to the transmissive area;
   a valley portion adjacent to a boundary between the bottom metal layer and the transmissive area; and
   a thin-film encapsulation layer on the valley portion, and comprising an inorganic layer and an organic layer.

2. The display panel of claim 1, wherein the valley portion is formed along an edge of the bottom metal layer, and is located within the transmissive area.

3. The display panel of claim 2, wherein the substrate comprises a base layer, and a barrier layer above the base layer, and
   wherein the valley portion is above the barrier layer.

4. The display panel of claim 3, wherein a lower surface of the valley portion and an upper surface of the base layer are apart by at least about 2,000 angstroms (Å).

5. The display panel of claim 3, wherein the valley portion has a height of about 5,000 angstroms (Å) or more and about 7,000 angstroms (Å) or less from the barrier layer.

6. The display panel of claim 1, wherein the inorganic layer is in the valley portion.

7. The display panel of claim 1, wherein the valley portion comprises:
   a first valley portion formed along an edge of the bottom metal layer and located within the transmissive area; and
   a second valley portion at least partially overlapping the bottom metal layer.

8. The display panel of claim 7, wherein the inorganic layer is in the first valley portion and in the second valley portion.

9. The display panel of claim 1, wherein an edge of the bottom metal layer defining the opening comprises first convex portions.

10. The display panel of claim 9, wherein the valley portion is formed along the edge of the bottom metal layer, and is located within the transmissive area.

11. The display panel of claim 10, wherein the valley portion comprises second convex portions corresponding to the first convex portions.

12. The display panel of claim 1, wherein the valley portion is above the transmissive area, and has an isolated shape.

13. A display panel comprising:
   a main display area;
   a component area having a transmissive area;
   a peripheral area outside the main display area;
   a substrate;
   a bottom metal layer on the substrate, and defining an opening corresponding to the transmissive area;
   a valley portion adjacent to a boundary between the bottom metal layer and the transmissive area and at least partially overlapping the bottom metal layer; and
   a thin-film encapsulation layer on the valley portion, and comprising an inorganic layer and an organic layer.

14. The display panel of claim 13, wherein a lower surface of the valley portion and an upper surface of the bottom metal layer are apart by about 1,000 angstroms (Å) or more.

15. The display panel of claim 13, further comprising a buffer layer above the substrate, wherein the valley portion has a height of about 5,000 angstroms (Å) to about 10,000 angstroms (Å) from the buffer layer.

16. A display apparatus comprising:
   a display panel comprising:
      a main display area;
      a component area having a transmissive area;
      a peripheral area outside the main display area;
      a substrate;
      a bottom metal layer on the substrate, and defining an opening corresponding to the transmissive area;
      a valley portion adjacent to a boundary between the bottom metal layer and the transmissive area; and
      a thin-film encapsulation layer on the valley portion, and comprising an inorganic layer and an organic layer; and
   a component arranged below the display panel to correspond to the component area.

17. The display apparatus of claim 16, wherein the component comprises an imaging device or a sensor.

18. The display apparatus of claim 16, wherein the valley portion is formed along an edge of the bottom metal layer and is located within the transmissive area.

19. The display apparatus of claim 16, wherein the valley portion at least partially overlaps the bottom metal layer.

20. The display apparatus of claim 16, wherein the valley portion comprises:
   a first valley portion formed along an edge of the bottom metal layer and located within the transmissive area; and
   a second valley portion at least partially overlapping the bottom metal layer.

* * * * *